(12) United States Patent
Omori et al.

(10) Patent No.: US 7,837,416 B2
(45) Date of Patent: *Nov. 23, 2010

(54) INDEXABLE CUTTING INSERT AND METHOD FOR PRODUCING THE SAME

(75) Inventors: Naoya Omori, Itami (JP); Yoshio Okada, Itami (JP); Minoru Itoh, Itami (JP); Norihiro Takanashi, Itami (JP); Shinya Imamura, Itami (JP)

(73) Assignee: Sumitomo Electric Hardmetal Corp., Hyogo (JP)

( * ) Notice: Subject to any disclaimer, the term of this patent is extended or adjusted under 35 U.S.C. 154(b) by 817 days.

This patent is subject to a terminal disclaimer.

(21) Appl. No.: 11/576,338

(22) PCT Filed: Jul. 24, 2006

(86) PCT No.: PCT/JP2006/314564

§ 371 (c)(1), (2), (4) Date: Mar. 29, 2007

(87) PCT Pub. No.: WO2007/013392

PCT Pub. Date: Feb. 1, 2007

(65) Prior Publication Data
US 2009/0232611 A1    Sep. 17, 2009

(30) Foreign Application Priority Data
Jul. 29, 2005   (JP)   ............... 2005-221130

(51) Int. Cl.
*B23B 27/14*   (2006.01)
*B23B 9/00*    (2006.01)
(52) U.S. Cl. ........................ 407/113; 407/119
(58) Field of Classification Search ............... 407/113, 407/114, 115, 116, 119
See application file for complete search history.

(56) References Cited

U.S. PATENT DOCUMENTS

| 4,990,036 | A  | * | 2/1991 | Eklund et al. ............ 407/113 |
| 5,861,210 | A  |   | 1/1999 | Lenander et al. |
| 6,217,263 | B1 | * | 4/2001 | Wiman et al. ............ 407/114 |
| 6,383,624 | B1 |   | 5/2002 | Soderberg et al. |
| 7,544,024 | B2 | * | 6/2009 | Omori et al. ............ 407/113 |
| 2002/0039521 | A1 |   | 4/2002 | Votsch et al. |
| 2002/0187370 | A1 |   | 12/2002 | Yamagata et al. |
| 2007/0248424 | A1 | * | 10/2007 | Omori et al. ............ 407/113 |
| 2008/0159820 | A1 | * | 7/2008 | Baernthaler et al. ...... 407/113 |

(Continued)

FOREIGN PATENT DOCUMENTS

JP    8-052603 A    2/1996

(Continued)

*Primary Examiner*—Will Fridie, Jr.
(74) *Attorney, Agent, or Firm*—Ditthavong, Mori & Steiner, P.C.

(57) ABSTRACT

An indexable cutting insert (1) of the present invention includes at least one face (2), at least two flanks (3), at least one edge line (4), at least one corner (9), and a base layer having a different color from a use-state indicating layer. The use-state indicating layer is formed on at least one of the flanks (3) so that the use-state indicating layer is formed on the base layer over the entire surface or a part of a region A2 excluding at least one region A1 of 2 mm² containing at least one corner (9).

11 Claims, 7 Drawing Sheets

U.S. PATENT DOCUMENTS

| | | | |
|---|---|---|---|
| 2008/0260476 A1* | 10/2008 | Ishida | 407/114 |
| 2008/0260477 A1* | 10/2008 | Omori et al. | 407/119 |
| 2008/0279644 A1* | 11/2008 | Endres | 408/56 |
| 2008/0292415 A1* | 11/2008 | Kuroda et al. | 407/61 |
| 2009/0004449 A1* | 1/2009 | Ban et al. | 428/216 |
| 2009/0232611 A1* | 9/2009 | Omori et al. | 407/114 |

FOREIGN PATENT DOCUMENTS

| | | |
|---|---|---|
| JP | 2002-144108 A | 5/2002 |
| JP | 2002-543993 A | 12/2002 |
| WO | WO 00/68454 | 11/2000 |
| WO | WO 02/04156 A1 | 1/2002 |
| WO | PCT/JP2006/314564 | 9/2006 |

* cited by examiner

INDEXABLE CUTTING INSERT AND METHOD FOR PRODUCING THE SAME

TECHNICAL FIELD

The present invention relates to an indexable cutting insert used for a cutting tool for cutting works and a method for producing the insert. More specifically, the present invention relates to an indexable cutting insert particularly useful for drilling, end milling, milling, turning, metal sawing, gear cutting, reaming, tapping, and crankshaft pin milling, and a method for producing the insert.

BACKGROUND ART

A turning tool or milling tool includes one or a plurality of indexable cutting inserts. As shown in FIG. 1, such an indexable cutting insert 1 has a face 2 present on the side where a cutting chip 6 of a work piece 5 is raised during cutting, and a flank 3 present on the side facing the work piece, the face 2 and the flank 3 being connected with an edge line 4 disposed therebetween, and the edge line 4 serving as a central point of an action of cutting the work piece 5.

When the indexable cutting insert reaches its tool life, it must be exchanged. In this case, when a insert has only one edge line, the insert itself must be exchanged. However, an indexable cutting insert having a plurality of edge lines can be turned several times on the same bearing surface so that an unused edge line is positioned at a cutting position, and thus the cutting insert can be used at a cutting position different from the previously used cutting position. In some cases, an unused edge line is attached to another bearing surface so that the edge line can be used.

However, at a cutting work site, an indexable cutting insert with an unused edge line may be exchanged or turned. This is due to the fact that when the edge is replaced or the edge line is turned, it is not recognized whether the edge line has been used or not. Therefore, this operation must be performed after whether the edge line has been unused or not is sufficiently recognized.

As a method for easily identifying a used edge line, an indexable cutting insert has been proposed, in which a flank and a face have different colors (Japanese Unexamined Patent Application Publication No. 2002-144108 (Patent Document 1)). Specifically, the indexable cutting insert includes a wear-resistant base layer formed on a body and referred to as a wear-reducing coating film, and a use-state indicating layer formed on the flank and composed of an easily wearing material.

Although such an indexable cutting insert having the above-mentioned constitution has an action of calling attention to whether the edge line has been used or not, the use-state indicating layer formed on the flank is readily welded to a work piece. There is thus the problem that the use-state indicating layer is welded to the surface of the work piece, and the cutting edge having unevenness due to welding of the work piece to the use-state indicating layer is used for a cutting work, thereby impairing the appearance and surface smoothness of the work piece after cutting.

Patent Document 1: Japanese Unexamined Patent Application Publication No. 2002-144108

DISCLOSURE OF INVENTION

Problem to be Solved by the Invention

The present invention has been achieved for solving the above-mentioned problem, and an object of the invention is to provide an indexable cutting insert capable of effectively exhibiting an attention calling function without impairing the appearance and surface smoothness of a work piece and a method for producing the cutting insert.

Means for Solving the Problem

In order to resolve the problem, the inventor intensively researched a contact state between an indexable cutting insert and a work piece in a cutting work. As a result it was found that when an edge line 4 of an indexable cutting insert 1 is in contact with a work piece 5 as shown in FIG. 1, a face 2 positions on the chip 6 side, a flank 3 faces the work piece 5, and thus welding of the work piece 5 significantly occurs at a specified position on the flank 3. As a result of further research on the basis of this finding, the present invention has been completed.

Namely, the present invention relates to an indexable cutting insert including a body, a base layer formed on the body, and a use-state indicating layer formed on the base layer. The body has at least one face, at least two flanks, at least one edge line, and at least one corner. Each of the flanks and the face are connected to each other with the edge line provided therebetween, and the corner is a point of intersection of the two flanks and the face. The base layer has a color different from the use-state indicating layer which is formed on at least one of the flanks so that the use-state indicating layer is formed on the base layer over the entire surface or a part of a region A2 excluding at least one region A1 of 2 mm$^2$ containing at least one corner.

It is preferable that the base layer is exposed from the region A1 and the face, and at least one layer constituting the exposed base layer has compressive residual stress in the region A1 or at least a portion of at least one of the regions involved in cutting with the face. The compressive residual stress is preferably 0.1 GPa or more in absolute value.

It is also preferable that when the surface roughness Ra of the region A1 is A μm, and the surface roughness Ra of the region A2 is B μm, the relation 1.0>A/B is established. The indexable cutting insert may have a plurality of edge lines.

It is further preferable that the use-state indicating layer may be a layer more easily wearing than the base layer, and the base layer includes an $Al_2O_3$ layer or an $Al_2O_3$-containing layer as an outermost layer.

It is further preferable that the outermost layer of the use-state indicating layer is composed of at least one metal (element) selected from the group consisting of the group IVa elements (Ti, Zr, and HO, the group Va elements (V, Nb, and Ta), and the group VIa elements (Cr, Mo, and W) in the periodic table, Al, Si, Cu, Pt, Au, Ag, Pd, Fe, Co, and Ni, an alloy containing the metal, or a compound containing at least one element selected from the group consisting of the group IVa elements, Va elements, and VIa elements in the periodic table, Al, and Si and at least one element selected from the group consisting of carbon, nitrogen, oxygen, and boron.

The body may include cemented carbide, cermet, high speed steel, ceramic, a cubic boron nitride sintered compact, a diamond sintered compact, or a silicon nitride sintered compact.

The indexable cutting insert can be used for drilling, end milling, milling, turning, metal sawing, gear cutting, reaming, tapping, or crankshaft pin milling.

The present invention also relates to a method for producing an indexable cutting insert including a body, a base layer formed on the body, and a use-state indicating layer formed on the base layer. The method includes the steps of forming the base layer on the body, forming the use-state indicating layer, which differs in color from the base layer, on the base layer, and removing the use-state indicating layer from a face and a region including at least one region A1 of 2 mm² on a flank, which includes at least one corner.

As described above, the indexable cutting insert of the present invention has at least one face and at least one flank, the flank and the face being connected to each other with an edge line provided therebetween, and the use-state indicating layer having a color different from that of the base layer and being formed at a specified position of the flank.

In this case, the use-state indicating layer preferably has as large color contrast as possible with the base layer. The use-state indicating layer formed at the specified position of the flank as described above preferably has the property of showing clear work marks after the indexable cutting insert is used in a cutting work within as a short time as possible, for example, several seconds to several minutes, and being at least partially abraded to expose the underlying layer (i.e., the base layer) with a different color. In a possible embodiment, the use-state indicating layer preferably has low wear resistance and low adhesive force to the base layer and is more easily abraded than the base layer.

On the other hand, the use-state indicating layer may be discolored as soon as the indexable cutting insert is used. Alternatively, the use-state indicating layer may be discolored (including a case in which the use-state indicating layer shows an appearance, as if discolored) by adhesion of a chip or cutting oil.

Alternatively, the use-state indicating layer may be discolored in another manner for indicating that the adjacent edge line has been used. For example, the use-state indicating layer may be heat-sensitive so that only the vicinity of the edge line is discolored at a temperature over 200° C. The discoloration is preferably based on oxidation or another change and is irreversible. Even when the adjacent edge line is used for only a short time, the use-state indicating layer in a portion adjacent to the edge line is discolored when the temperature exceeds a predetermined temperature within a short time, and the discoloration is continuously clearly recognized. The discoloration due to a thermal function is advantageous in that discoloration occurs in not only a portion in direct contact with the work piece during operation but also a wide region in contact with a chip at a high temperature, thereby permitting easy identification of the used edge line.

Whether the indexable cutting insert has been used and which edge line is still unused can be simply and easily determined by determining whether work marks or discoloration occurs in the use-state indicating layer. In other words, the use-state indicating layer has an attention calling function. Therefore, the indexable cutting insert can be appropriately exchanged or turned. In particular, it is possible to avoid overlooking already used indexable cutting inserts which must be replaced, replacing unused indexable cutting inserts with new ones, setting already used edge lines at a cutting position when turning the indexable cutting insert, or leaving unused edge lines to remain unused. Therefore, the indexable cutting insert of the present invention can significantly simplify the maintenance of the cutting tool.

The indexable cutting insert of the present invention exhibits the attention calling function and includes the use-state indicating layer formed only in a specified portion of the flank, thereby exhibiting the significant effect of resolving the problem of related art that the appearance and surface smoothness of a work piece are impaired after a cutting work. In a conventional indexable cutting insert having an attention calling function, a use-state indicating layer is formed on an edge line and the vicinity thereof, and thus the use-state indicating layer is welded to a work piece to impair the appearance of the work piece after a cutting work and deteriorating the surface roughness thereof. In addition, cutting resistance may be increased to cause a defect in the cutting edge. Therefore, the type of a work piece and application are limited, and some work pieces cannot be cut with such an indexable cutting insert. The present invention can resolve the problems and has high industrial usefulness.

It is preferable that the use-state indicating layer is formed to have a light color, e.g., yellow or yellowish gloss (for example, gold color), while the base layer is formed to have a dark color. For example, the base layer preferably includes an aluminum oxide ($Al_2O_3$) or aluminum oxide-containing coating. In addition, additional layers may be provided below or on the top of the $Al_2O_3$ layer.

Therefore, the indexable cutting insert of the present invention can be formed by laminating the layers, wherein the $Al_2O_3$ layer serving as the base layer forms a wear-resistant layer. In the present invention, the wear-resistant layer represents a coating having the function to increase the wear resistance of the cutting edge during use in a cutting work, thereby increasing the tool life and cutting speed.

On the other hand, the wear-resistance layer may further hold an auxiliary surface layer. Instead of the $Al_2O_3$ layer, a wear-resistant layer having the same or better properties can be provided.

In order to produce the indexable cutting insert according to the present invention, an $Al_2O_3$-containing coating serving as the wear-resistant layer is first formed over the entire surface of the body to form the base layer. Then, a nitride layer (for example, TiN) can be formed as the top layer to form the use-state indicating layer. The nitride layer may be formed to cover the entire surface of the base layer and then removed from the face and the specified regions of the flank.

In particular, the nitride layer used as the use-state indicating layer must be removed from at least one region A1 of 2 mm² in the flank, which contains at least one corner. This removal can be performed by any desired method, for example, mechanical removal, more specifically, a brushing operation, a barreling operation, or a blasting (sand blasting) operation.

In the brushing or blasting operation, post-processing of the edge line is also performed to smoothen the edge line. This contributes to a decrease in welding to the work piece and an increase in lifetime of the indexable cutting insert. Masking permits the use-state indicating layer to remain in a portion where the use-state indicating layer is desired to remain.

ADVANTAGE OF THE INVENTION

The indexable cutting insert of the present invention has the above-mentioned constitution and can thus effectively exhibit the attention calling function without impairing the appearance and surface smoothness of the work piece.

REFERENCE NUMERALS

Figure 1:
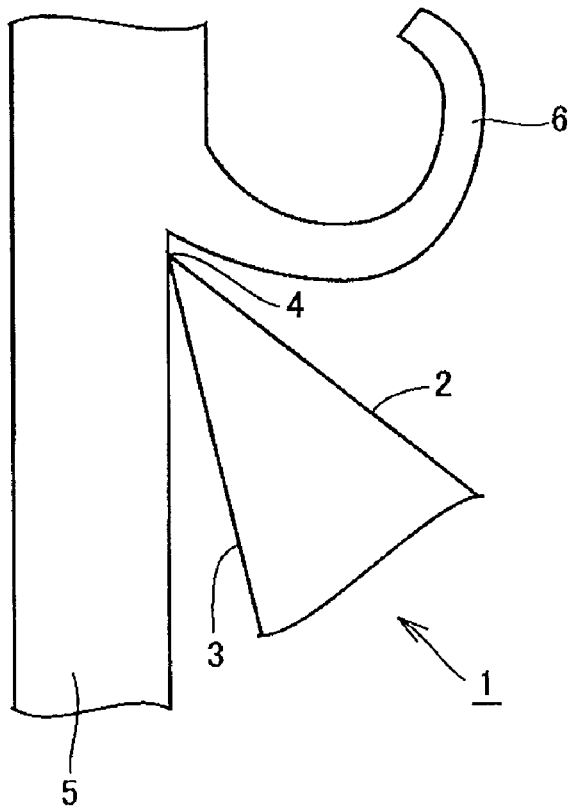
FIG. 1 is a schematic drawing schematically showing a contact state between an indexable cutting insert and a work piece in a cutting work.

1 ... indexable cutting insert, 2 ... face, 3 ... flank, 4 ... edge line, 5 ... work piece, 6 ... chip, 7 ... through hole, 8 ... body, 9 ... corner, 10, 11 ... discoloration region, 12 ... base layer, 13 ... use-state indicating layer, 14 ... coating

BEST MODE FOR CARRYING OUT THE INVENTION

The present invention will be described in further detail below. In the description of embodiments below with reference to the drawings, the same reference numeral in the drawings denotes the same or corresponding portion. Each of the drawings is a typical drawing for description, and the size ratio of a coating thickness to a body and the size ratio of R of a corner differ from actual values.

<Indexable Cutting Insert and Body>

Figure 2:
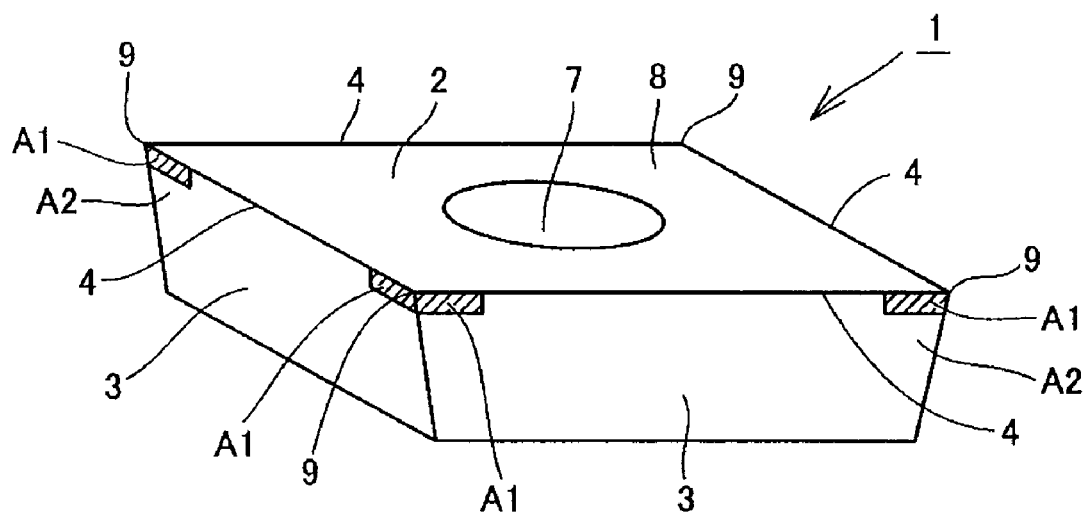
FIG. 2 is a schematic perspective view of an indexable cutting insert according to an embodiment of the present invention.

An indexable cutting insert of the present invention includes a body, a base layer formed on the body, and a use-state indicating layer formed on the base layer. FIG. 2 shows an indexable cutting insert 1 having a square top surface. The indexable cutting insert 1 has a body 8 which is preferably made of, for example, cemented carbide. For example, the body 8 can be made of sintered tungsten carbide or another cemented carbide material. The body 8 can be made of a ceramic material.

The material for the body is not particularly limited, and general known materials for bodies (base materials) of such indexable cutting inserts can be used. Examples of the material include cemented carbides (e.g., WC-based cemented carbide and cemented carbide containing WC and Co or further containing carbide, nitride, or carbonitride of Ti, Ta, or Nb), cermet (mainly composed of TiC, TiN, or TiCN), high speed steel, ceramics (titanium carbide, silicon carbide, silicon nitride, aluminum nitride, aluminum oxide, or a mixture thereof, cubic boron nitride sintered bodies, diamond sintered bodies, and silicon nitride sintered bodies. The surface of the body (base material) may be modified. For example, a beta-free layer may be formed on the surface of cemented carbide, or a surface hardened layer may be formed on cermet. Even when such surface modification is made, the advantage of the present invention is exhibited.

Further, the body 8 may have a polyhedral shape. As shown in FIG. 2, such a polyhedral shape can include at least a bottom, a plurality of side surfaces, and a top surface. However, the shape is not limited to this, and any polyhedral shape may be used. In the body 8, at least one surface serves as a face 2 which will be described below, and at least two other surfaces serve as flanks 3. The face 2 and each of the flanks 3 are connected to each other with an edge line 4 (represented by an intersection line of the face and each flank 3 in FIG. 2) provided therebetween. A point of intersection of the two flanks and the face is a corner 9.

In other words, in the present invention, the body includes at least one face, at least two flanks, at least one edge line, and at least one corner.

The indexable cutting insert of the present invention includes two types, i.e., the type in which a chip breaker is formed and the type in which a chip breaker is not formed. In the indexable cutting insert of the present invention, a through hole 7 may be formed to pass through the body from the top to the bottom and used as a fixing hole for attaching the indexable cutting insert 1 to a tool. If required, in addition to or instead of the fixing hole, another fixing device may be provided.

The indexable cutting insert of the present invention is particularly useful for drilling, end milling, milling, turning, metal sawing, gear cutting, reaming, tapping, and crankshaft pin milling. The present invention is effective to both negative type and positive type indexable cutting inserts.

<Face, Flank, Edge Line, and Corner>

In the body 8, at least one of the surfaces serves as the face 2, and at least two other surfaces serve as the flanks 3, the face 2 and each of the flanks 3 being connected to each other with the edge line 4 (corresponding to the intersection line of the face and each flank) provided therebetween. The point of intersection of the two flanks and the face is the corner 9.

The indexable cutting insert 1 preferably has a plurality of edge lines 4 as shown in FIG. 2. This is because after one of the edge lines is used, another edge line can be used to decrease the time required for replacing the indexable cutting insert itself. In the present invention, the idea of the expressions "face", "flank", "edge line", and "corner" includes not only the portions and surfaces disposed on the uppermost surface of the indexable cutting insert but also the surfaces of the body and the surfaces and corresponding internal portions of each of the layers such as the base layer, the use-state indicating layer, and the like.

Each of the edge lines 4 and the corners 9 forms a central point of the action of cutting a work piece. In FIG. 2, the edge lines 4 are linear, but are not limited to this. For example, the edge lines 4 may be circumferential, ruffled, curved, or bent. The edge lines and the corners can be subjected to edge processing such as chamfering and/or R-imparting processing (e.g., refer to FIG. 5). When the edge lines do not form clear edges or the corners do not form clear points of intersection due to edge processing, the face and the flank which undergo the edge processing are geometrically extended on the basis of a state before the edge processing to determine an edge or point of intersection between both faces as a hypothetic edge or point of intersection so that the hypothetically determined edge is regarded as an edge line or the hypothetically determined point of intersection is regarded as a corner. The expression "the face and the flank are connected to each other with the edge line provided therebetween" and the expression "having the edge lines" include the case in which the edge lines are subjected to the above-descried edge processing. The expression "the point of intersection of two flanks and one face" and the expression "the point of intersection is a corner" include the case in which the corners are subjected to the edge processing.

Although the face 2 is shown as a flat surface in FIG. 2, the face may have another structure, for example, a structure having a chip breaker or the like, according to demand. This applies to the flanks 3. Although the flanks 3 are shown as flat surfaces in FIG. 2, the flanks 3 may be chamfered (divided into a plurality of surface regions), formed into a shape different from a flat surface or a curved surface using another method, or provided with a chip breaker.

<Base Layer>

Figure 5:
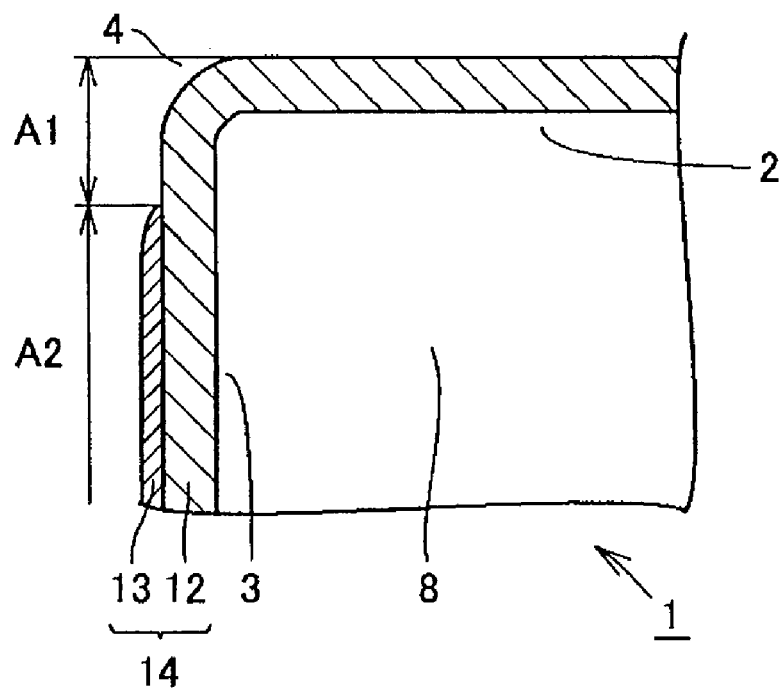
FIG. 5 is an enlarged sectional view of an edge line (including a corner) of an indexable cutting insert.

The base layer 12 formed on the body 8 assumes a color different from that of the use-state indicating layer 13 which will be described below. Description will be made on the basis of FIG. 5 showing the structure of a coating 14 provided on the indexable cutting insert 1. The base layer 12 extending on the face 2 and the flanks 3 is included in the coating 14. The base layer 12 is formed on the surface of the body 8. The base layer 12 may be formed on at least the face 2 or formed on the face 2 and the flanks 3. In particular, the base layer 12 is preferably formed over the entire surface of the body 8.

More specifically, the base layer 12 is exposed in the region A1 and the face 2 in view of the relation to the use-state indicating layer 13. In other words, the base layer 12 is exposed in the surface of a portion where the use-state indicating layer 13 is not formed.

In the exposed region of the base layer 12, at least one layer constituting the base layer preferably has compressive residual stress in the region A1 or in at least a portion of at least one of regions involved in cutting with the face 2. In this case, it is possible to impart toughness and effectively prevent a defect of the cutting edge. The regions involved in cutting with the face 2 depend on the shape of the indexable cutting insert, the type and size of the work piece, and the type of the cutting work. However, the regions involved in cutting generally represent regions extending with a width of 3 mm from edge lines which come into contact with the work piece (or come closest to the work piece) toward the face.

The purpose for specifying the region A1 or at least a portion of at least one of the regions involved in cutting with the face is that although compressive residual stress is preferably imparted to the entire region, compressive residual stress may not be imparted in a portion of the region according to various circumferences.

The compressive residual stress is a type of internal stress (inherent distortion) present in a coating (coated layer) and is represented by a minus value (unit used in the present invention: GPa). Therefore, the idea of high compressive residual stress corresponds to a large absolute value, and the idea of low compressive residual stress corresponds to a small absolute value. On the other hand, tensile residual stress is a type of internal stress (inherent distortion) present in a coated layer and is represented by a plus value. The term "residual stress" means both the compressive residual stress and the tensile residual stress.

The compressive residual stress possessed by the base layer 12 is preferably 0.1 GPa or more, more preferably 0.2 GPa or more, and most preferably 0.5 GPa or more in absolute value. When the absolute value is less than 0.1 GPa, sufficient toughness cannot be obtained in some cases. On the other hand, the absolute value is preferably as large as possible from the viewpoint of imparting toughness. However, when the absolute value exceeds 8 GPa, the coated layer undesirably peels in some cases.

The compressive residual stress is preferably possessed by at least one layer constituting the base layer in the region and more preferably possessed by at least the outermost layer constituting the base layer. This is because the uppermost layer possibly most contributes to improvement in defect resistance.

The residual stress may be measured by any method, for example, a $\sin^2 \phi$ method using an X-ray stress measuring apparatus. The residual stress can be measured as follows: Stress is measured by the $\sin^2 \phi$ method at any desired 10 points (preferably selected to be spaced 0.1 mm or more apart so that each of the points is representative of the stress of a region of the base layer) which are included in a region of the base layer to which the compressive residual stress is imparted, and the measurement values are averaged.

The $\sin^2 \phi$ method using an X-ray is widely used as a method for measuring residual stress of polycrystalline materials. For example, the method described in "X-ray Stress Measurement Method" (The Society of Materials Science, Japan, issued by Yokendo Co., Ltd., 1981), pp. 54-67 may be used.

The residual stress may be measured by a method using Raman spectroscopy. The Raman spectroscopy has the advantage that it is capable of local measurement in a narrow region with a spot diameter of, for example, 1 μm. The Raman spectroscopic measurement of residual stress is generally known, but the method described in, for example, "Evaluation Technique for Thin Film Kinetic Properties" (Cipec (altered to Realize Advanced Technology Limited), 1992), pp. 264-271 may be used.

Further, the residual stress can also be measured using radiant light. This method has the advantage that a residual stress distribution can be determined in the thickness direction of the base layer (coating layer).

The base layer 12 can be formed by a known chemical vapor deposition method (CVD method) or physical vapor deposition method (PVD method including a sputtering method). The formation method is not limited. For example, when the indexable cutting insert 1 is used for drilling or end milling, the base layer is preferably formed by the PVD method capable of forming the base layer without decreasing transverse rupture strength. The thickness of the base layer is preferably controlled by controlling the deposition time.

When the base layer is formed by a known CVD method, the base layer is preferably provided with a layer formed by a MT-CVD (medium temperature CVD) method. In particular, the base layer is most preferably provided with a titanium carbonitride (TiCN) layer having excellent wear resistance which is formed by the MT-CVD method. A conventional CVD method is capable of forming a film at about 1020° C. to 1030° C., while the MT-CVD method is capable of forming a film at a relatively low temperature of about 850° C. to 950° C. and thus decreasing damage to the body due to heating in the deposition. Therefore, a layer formed by the MT-CVD method is preferably provided adjacent to the body. As the gas used in the deposition, nitrile gas, particularly acetonitrile ($CH_3CN$), is preferably used because of its excellent productivity. A laminated structure of a layer formed by the MT-CVD method and a layer formed by a HT-CVD (high temperature CVD, i.e., conventional CVD) method is preferred because the adhesive force between the coated layers may be increased.

On the other hand, a method for imparting the compressive residual stress to the base layer 12 is not particularly limited. For example, when the base layer 12 is formed by the CVD method, the compressive residual stress can be imparted, by a blasting method, to a region of the base layer to which the compressive residual stress to be imparted, after the base layer 12 is formed. The region to be treated by the blasting method may be a wider region extending beyond the above-described region (the region A1 or at least one of the regions involved in cutting with the face). On the other hand, when the base layer 12 is formed by the PVD method, the compressive residual stress is imparted during the formation of the base layer, and thus the above-described processing need not be performed.

Although the compressive residual stress may be imparted to the base layer 12 by the PVD method for forming the base layer 12, the compressive residual stress is preferably imparted to the base layer 12 by blasting after the base layer 12 is formed by the CVD method in view of the adhesion between the base layer 12 and the body 8.

Although the blasting can be performed after the formation of the base layer 12, the blasting treatment may also be performed as an operation of removing the use-state indicating layer 13 from the region A1 or at least one of the regions involved in cutting with the face after the use-state indicating layer 13 is formed on the base layer 12. This treatment method is preferred because the production efficiency of the indexable cutting insert 1 is improved. In this case, a portion where the use-state indicating layer 13 is left is preferably masked with a jig or the like.

The blasting is a surface treatment method for removing a film, rust, or dust from the surface of a material to be treated according to any one of the methods (1) to (3) below, and is used in many industrial fields.

(1) Particles of any one of various abrasive materials are sprayed on the surface of the material to be treated using compressed air.

(2) Particles of any one of various abrasive materials are continuously ejected to the surface of the material to be treated using a rotor blade.

(3) A liquid (water) containing articles of any one of various abrasive materials is sprayed to the surface of the material to be treated under high pressure.

General examples of the particles of various abrasive materials include steel grids, steel shots, cut wires, alumina, glass beads, and silica sand. The blasting may be called sand blasting, shot blasting, alumina blasting, glass beads blasting, or the like according to the particle type.

For example, sand blasting represents a method of spraying abrasive particles of silica sand (powder) to the surface of the material to be treated using compressed air, and shot blasting represents a method using steel shots (usually spherical). In addition, wet blasting represents a method of spraying a liquid (water) containing abrasive particles to the surface of the material to be treated under high pressure.

The specific conditions for the blasting depend on the type and application method of the abrasive particles (abrasive grains) used. For example, details of metal abrasive materials for blasting are defined in JIS Z0311: 1996, and details of non-metal abrasive materials for blasting are defined in JIS Z0312: 1996. Details of shot blasting are defined in JIS B6614: 1998. The blasting method of the present invention can use any of the conditions.

As the method for imparting the compressive residual stress to the base layer 12, the above-described blasting, brushing, shot peening, barreling, or ion implantation may be used.

The base layer 12 may include one layer or a plurality of laminated layers, and preferably exhibits the function as a wear-resistant layer. The base layer 12 can be composed of a compound of at least one element selected from the group consisting of the group IVa elements (Ti, Ar, and Hf), the group Va elements (V, Nb, and Ta), and the group VIa elements (Cr, Mo, and W) in the periodic table, and Al and Si and at least one element selected from the group consisting of carbon, nitrogen, oxygen, and boron. In this case, excellent performance can be exhibited.

For example, the base layer 12 may be an $Al_2O_3$ layer or may contain $Al_2O_3$ as such a compound. A TiN layer, a TiCN layer, and an $Al_2O_3$ layer may be formed on the body 8 in that order. The three-layer type forms the base layer 12 as a whole and functions as a wear-resistant layer.

When the base layer 12 includes a plurality of laminated layers, the base layer 12 preferably includes an $Al_2O_3$ layer or an $Al_2O_3$-containing layer as the outermost layer. The $Al_2O_3$ layer or $Al_2O_3$-containing layer is excellent as the wear-resistant layer and has a dark color (correctly, it does not assume a black color and is easily influenced by the color of an underlying layer, but the color of the layer may be expressed as black). Therefore, a significant contrast is formed between the base layer 12 and the use-state indicating layer formed thereon.

The $Al_2O_3$ layer or $Al_2O_3$-containing layer is exposed in the region A1 or at least one of the regions involved in cutting with the face, and particularly preferably has compressive residual stress in at least a portion of the region. Consequently, both the high sear resistance and toughness can be satisfied in a portion most involved in defect resistance. From this viewpoint, the compressive residual stress is more preferably possessed by the entire region including the region A1 and the regions involved in cutting with the face. The compressive residual stress is preferably 0.1 GPa or more, more preferably 0.2 GPa or more, and most preferably 0.5 GPa or more in absolute value. On the other hand, the absolute value is preferably as large as possible from the viewpoint of imparting toughness. However, when the absolute value exceeds 8 GPa, the layer itself undesirably peels. The crystal structure of $Al_2O_3$ constituting the $Al_2O_3$ layer or $Al_2O_3$-containing layer is not particularly limited and may be $\alpha$-$Al_2O_3$, $\kappa$-$Al_2O_3$, $\gamma$-$Al_2O_3$, amorphous $Al_2O_3$, or a mixture thereof. The $Al_2O_3$-containing layer means a layer containing at least $Al_2O_3$ (a layer containing 50% by weight or more of $Al_2O_3$), and the balance may be composed of another compound, $ZrO_3$, or $Y_2O_3$ (alumina containing Zr or Y), or may further contain chlorine, carbon, boron, or nitrogen.

Examples of a compound constituting the base layer 12, other than $Al_2O_3$ (or in combination with $Al_2O_3$) include TiC, TiN, TiCN, TiCNO, $TiB_2$, TiBN, TiBNO, TiCBN, ZrC, $ZrO_2$, HfC, HfN, TiAlN, AlCrN, CrN, VN, TiSiN, TiSiCN, AlTiCrN, TiAlCN, ZrCN, ZrCNO, AlN, AlCN, ZrN, and TiAlC. As a preferred example of the base layer 12, a TiN layer of several μm in thickness is formed over the entire surface of the body 8, a TiCN layer of several μm is formed thereon, and an $Al_2O_3$ layer (or $Al_2O_3$-containing layer) of several μm is further formed thereon. In this case, the function as the wear-resistant layer is exhibited.

As a more preferred example, a layer composed of a compound containing Ti and at least one element of nitrogen, oxygen, and boron is formed as an underlying layer of the $Al_2O_3$ layer or $Al_2O_3$-containing layer. In this case, excellent adhesion can be achieved between the $Al_2O_3$ layer or $Al_2O_3$-containing layer and the underlying layer, thereby exhibiting more excellent wear resistance. Specific examples of such a compound include TiN, TiBN, TiBNO, and TiCNO. Other preferred examples of the compound include AlON and AlCNO.

When the wear-resistant layer is used as the base layer 12, the tool life of the indexable cutting insert can be significantly increased. In addition, the indexable cutting insert has the advantage that it exhibits the function to withstand a severe work environment at an elevated cutting speed or the like. This advantage can be preferably effectively achieved by forming the base layer 12 over the entire surface of the body.

The thickness of the base layer 12 (the total thickness when formed as a laminate of two or more layers) is preferably 0.05 μm to 20 μm. With a thickness of less than 0.05 μm, the wear resistance is not improved, while with a thickness of over 20 μm, the wear resistance is not much improved, thereby causing an economic disadvantage. However, the thickness may be 20 μm or more as long as economy is neglected, and the advantage of the invention is exhibited. As a method for measuring the thickness, for example, the indexable cutting insert is sliced, and a section is measured by observation with SEM (scanning electron microscope) to measure the thickness.

<Use-State Indicating Layer>

As shown in FIGS. 2 and 5, the use-state indicating layer 13 of the present invention is formed on at least one of the flanks 3 so that the use-state indicating layer 13 is formed on the base layer 12 over the entire surface or a portion of the region A2 excluding at least one region A1 of at least 2 $mm^2$ or more including at least one corner 9. From a geometrical viewpoint, each of the corners 9 is the point of intersection (hypothetical point of intersection when the above-mentioned edge processing is performed) of the base layer (surface thereof) on the two flanks and the base layer (surface thereof) on the face. However, the thickness of the base layer is extremely smaller than the total thickness of the indexable cutting insert, and thus whether or not the thickness of the base layer is taken into consideration is substantially not a problem in specifying the position of an edge line. It is generally sufficient to specify an edge line on the basis of the counter of the indexable cutting insert.

As a result of research performed by the inventor, it was found that welding to the work piece significantly occurs in the region A1. The present invention exhibits the excellent effect of providing the attention calling function while effectively preventing welding to the work piece by forming the use-state indicating layer over the entire region or a portion of the region A2 excluding the region A1 and preventing damage to the appearance and surface roughness of the work piece after the cutting work.

When the region A1 has an area of less than 2 $mm^2$, the above excellent effect is not exhibited because welding to the work piece occurs. On the other hand, the area is preferably as large as possible from the viewpoint of preventing welding to the work piece, and the upper limit need not be determined. However, when the area of the region A1 is excessively large, the use-state indicating layer may not sufficiently exhibit the attention calling function. Therefore, the use-state indicating layer must be formed so as to exhibit the function. Therefore, when the thickness of the indexable cutting insert is 2 mm to 8 mm, the lower limit of the area is 2 $mm^2$ or more and more preferably 5 $mm^2$ or more. When the thickness of the indexable cutting insert is 2 mm to 8 mm, the upper limit is preferably less than 100 $mm^2$ and more preferably less than 70 $mm^2$. The area is preferably appropriately selected in the range according to the size of the indexable cutting insert.

In this way, the use-state indicating layer is preferably formed in the region A2 at an area ratio of 20% or more, more preferably 50% or more, and most preferably 80% or more. This can provide the sufficient attention calling function while preventing welding to the work piece.

The use-state indicating layer 13 can be formed by a known chemical vapor deposition, physical vapor deposition (including sputtering), vacuum vapor deposition, or plating method. The formation method is not particularly limited.

The definition "at least one region A1" means that the number of corners involved in cutting varies depending on the shape of the indexable cutting insert and the application thereof, and the region A1 includes at least a corner involved in cutting. Namely, the definition means that when there is a plurality of corners involved in cutting, a plurality of regions A1 may be formed. The region A1 may be formed continuously over at least two flanks as long as it has an area of at least 2 $mm^2$ and may have a plurality of corners. When the region A1 is formed continuously over at least two flanks, an area of at least 2 $mm^2$ is a total area of the continuous region, not an area per flank.

The reason for defining only an area of "at least 2 $mm^2$" without specifying the shape of the region, the use-state indicating layer is appropriately removed in a region of a shape corresponding to the shape and application of the indexable cutting insert because the shape and application of the indexable cutting insert vary greatly.

The reason for the definition "the entire surface of a portion of the region A2" is that when only a specified corner is involved in cutting, the attention calling function can be achieved by disposing the use-indicating layer in only a portion adjacent to the portion involved in cutting, and thus the use-state indicating layer need not be formed in a large area to cover the entire surface of the region A2. Therefore, the use-state indicating layer 13 may be formed over the entire surface of the region A2 or only a portion of the region A2.

With respect to the boundary between a portion (the region A2) in which the use-state indicating layer is formed and a portion (the region A1) in which the use-state indicating layer is not formed, when the area of the use-state indicating layer formed in the vicinity of the boundary, which is observed by an electron microscope and/or a metal microscope, is 80% or more of a unit area (100 μm×100 μm), it is determined that the use-state indicating layer is formed. Therefore, the region A1 with an area of at least 2 $mm^2$ is preferably measured by an electron microscope and/or a metal microscope.

In this embodiment, the use-state indicating layer 13 is a titanium nitride layer with a yellow or brass yellow (gold color) appearance. On the other hand, the lower base layer 12 has a black or dark color due to $Al_2O_3$ (the outermost layer in the base layer). The use-state indicating layer 13 preferably easily wears as compared with the base layer 12. This is because the use-state indicating layer 13 is easily cut in a cutting work to expose the lower base layer 12, and thus a used portion can be easily indicated. In addition, the use-state indicating layer is removed from a portion other than the region A2, and thus the production of the indexable cutting insert is facilitated.

The use-state indicating layer 13 has a color different from that of the base layer 12 and is formed in the specified portions described above. As a result, a large color contrast is produced between a peripheral region of each corner and the other region. This is because as described above, the base layer 12 serving as the wear-resistant layer is formed on the surface of a peripheral region of each corner.

When the use-state indicating layer 13 is formed of the base layer 12 over the entire region or a portion of the region A2 excluding the region A1, the appearance and surface roughness of the work piece is not impaired by welding of the use-state indicating layer 13 to the work piece during a cutting work. Therefore, the attention calling function can be exhibited without this disadvantage. The use-state indicating layer 13 can be formed as a single layer or a laminate of a plurality of layers.

The use-state indicating layer 13 is at least one layer composed of at least one metal (element) selected from the group consisting of the group IVa elements, the group Va elements, and the group VIa elements in the periodic table, Al, Si, Cu, Pt, Au, Ag, Pd, Fe, Co, and Ni, an alloy containing the metal, or a compound containing at least one element selected from the group consisting of the group IVa elements, Va elements, and VIa elements in the periodic table, Al, and Si and at least one element selected from the group consisting of carbon, nitrogen, oxygen, and boron. Any one of these layers is preferred because it has a clear color and can be industrially easily produced. In particular, when two or more layers are laminated, any one the above layers is preferably formed as the outermost layer.

The outermost layer of the use-state indicating layer is particularly preferably a layer composed of at least one metal selected from the group consisting of the group IVa elements, the group Va elements, and the group VIa elements in the periodic table, Al, Si, Cu, Pt, Au, Ag, Pd, Fe, Co, and Ni, or a compound containing at least one element selected from the group consisting of the group IVa elements, Va elements, and VIa elements in the periodic table, Al, and Si and at least one element selected from the group consisting of carbon, nitrogen, oxygen, and boron. The compound assumes a clear color such as yellow, pink, brass yellow, or gold, has excellent graphical design function, and can form a clear contrast with the base layer. When the use-state indicating layer is formed as a single layer, it forms the outermost layer.

More specifically, the use-state indicating layer can be formed using an element (metal) or a compound other than TiN, such as TiC, TiCN, TiCNO, $TiB_2$, TiBN, TiBNO, TiCBN, ZrC, $ZrO_2$, HfC, HfN, TiAlN, AlCrN, CrN, VN, TiSiN, TiSiCN, AlTiCrN, TiAlCN, $Al_2O_3$, ZrCN, ZrCNO, AlN, AlCN, ZrN, TiAlC, Cr, or Al.

Furthermore, the use-state indicating layer 13 does not have the strong function to improve wear resistance (i.e., preferably an easily wearing layer with lower wear resistance than that of the base layer) and has a relatively small thickness. The thickness (the total thickness when the use-state indicating layer includes two or more layers) is preferably 0.05 μm to 2 μm and more preferably 0.1 μm to 0.5 μm. With a thickness of less than 0.05 μm, uniform coating on a predetermined portion is industrially difficult, thereby causing color variation in the appearance and impairing the appearance. With a thickness of over 2 μm, the function as the use-state indicating layer is not much increased, and thus such a thickness is economically disadvantageous. The thickness can be measured by the same method as that for the base layer.

The use-state indicating layer 13 may have compressive residual stress. Therefore, the toughness of the indexable cutting insert can be improved. The compressive residual stress is preferably 0.1 GPa or more, more preferably 0.2 GPa or more, and most preferably 0.5 GPa or more in absolute value. When the absolute value is less than 0.1 GPa, sufficient toughness cannot be obtained in some cases. On the other hand, the absolute value is preferably as large as possible from the viewpoint of imparting toughness. However, when the absolute value exceeds 8 GPa, the use-state indicating layer undesirably peels in some cases. The compressive residual stress can be imparted to the use-state indicating layer 13 by the same method as that for imparting the compressing residual stress to the base layer.

<Surface Roughness Ra>

In order to inhibit welding to the work piece, the region A1 is preferably smoothened. The surface smoothness can be attained by mechanical processing, for example, a brushing operation or blasting (sand blast). The mechanical processing is generally performed for removing the use-state indicating layer formed on the base layer. However, the mechanical processing can be performed as an independent processing operation for the surface of the region A1. The smoothness can also be obtained by a method other the mechanical processing, for example, chemical processing or physical processing.

As a result of research performed by the invention, it was found that when the surface roughness Ra of the region A1 and the surface roughness Ra of the region A2 have the relation of 1.0>A/B wherein A (μm) and B (μm) are the surface roughness of the regions A1 and A2, respectively, the particularly high resistance to work piece welding can be obtained. The relation is preferably 0.8>A/B and more preferably 0.6>A/B.

The surface roughness Ra is represented by a numerical value and referred to as an "arithmetic mean height" (JIS B0601: 2001). The measurement method is not particularly limited, and any known measurement method can be used. For example, a contact method (e.g., a stylus method) or a non-contact method (e.g., a laser microscopic method) may be used, or a section of the indexable cutting insert may be observed directly with a microscope.

<Method for Producing Indexable Cutting Insert>

The method for producing the indexable cutting insert including the body, the base layer formed on the body, and the use-state indicating layer formed on the base layer according to the present invention includes the steps of forming the base layer on the body, forming the use-state indicating layer of a color different from the base layer on the base layer, and removing the use-state indicting layer from the face and a region including at least one region A1 of at least 2 mm² on the flanks of the body, the region A1 including at least one corner.

The production method is capable of producing, with high productivity, the indexable cutting insert including the body, the base layer formed on the body, and the use-state indicating layer formed on the base layer, the use-state indicating layer being formed on at least one flank so that the use-state indicating layer is formed on the base layer in the entire surface or a portion of the region A2 excluding at least one region A1 of at least 2 mm² including at least one corner.

In producing the indexable cutting insert 1, the use-state indicating layer 13 is formed on the base layer 12 and then removed from the region including at least the region A1. As a result, the indexable cutting insert with a large color contrast between the region A1 and another region (where the use-state indicating layer is not removed) can be produced.

As described above, the use-state indicating layer 13 can be removed by a blasting method. By using the blasting method, the compressive residual stress can be imparted to the base layer 12 at the same time, and the effect of smoothing the surface of the exposed portion of the base layer 12 can be obtained. The use-state indicating layer 13 can be removed by a brushing method instead of the blasting method.

The method for producing the indexable cutting insert of the present invention can further include the step of smoothing the region A1 (including the case in which the smoothing step is performed at the same time as the step of removing the use-state indicating layer). The smoothing treatment is preferably performed so that when the surface roughness Ra of the region A1 is A μm, and the surface roughness Ra of the region A2 is B μm, the relation 1.0>A/B is established. This is because the appearance and surface smoothness of the work piece can be secured after the cutting work.

As the smoothing treatment, the above-described blasting method or any one of various chemical and physical methods can be used. For example, the blasting method and the brushing method can be combined.

<Operation>

The above-described indexable cutting insert has the face 2 and the flanks 3 which are undamaged in an unused state as shown in FIG. 2. In particular, the entire region or a portion of the region A1 excluding the region A1 has the original color of the use-state indicating layer 13, thereby showing that the edge lines 4 (including the corners 9) are still unused. For example, when the entire surface or a portion of the region A2 is coated with TiN, the use-state indicating layer 13 in the region A2 is bright brass yellow (gold color) in an unused state. On the other hand, the region A1 has an appearance with a relatively dark color or substantially black color, which is a typical color of the indexable cutting insert, because $Al_2O_3$ of the base layer 12 is exposed in the surface of the region A1.

In the description below, consideration is given to the case in which the indexable cutting insert 1 is attached to a body of a cutting tool, and any one of the corners 9 is first used. The corner 9 comes into contact with the work piece as soon as the cutting tool is used to start cutting the work piece 5. In particular, in the region A1 in the periphery of the corner 9, wear of the indexable cutting insert 1 is decreased by the base layer 12.

When cutting with the corner 9 is started, the use-state indicating layer 13 in the region (the region A2 excluding the region A1) adjacent to the corner 9 is discolored to produce a relatively large initial change. The discolored region is turned to a color different from that of the use-state indicating layer 13, and in some cases, the base layer 12 which is darker than the color appears.

Figure 3:
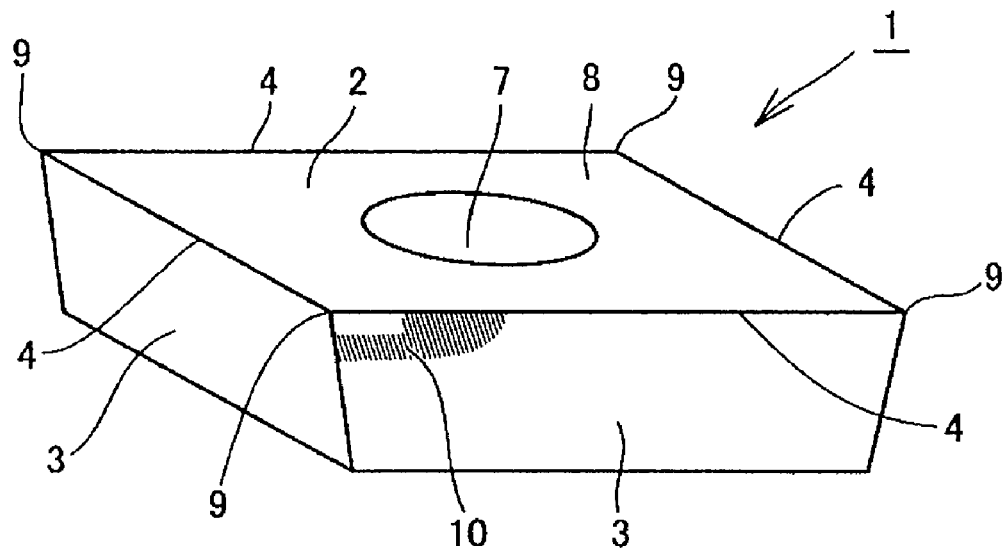
FIG. 3 is a schematic perspective view of an indexable cutting insert according to the present invention after the use of one edge line (including a corner).

Therefore, as shown in FIG. 3, a dark discolored region 10 is produced in the region A2 adjacent to the corner 9. The discolored region 10 is immediately and easily identified to exhibit the attention calling function. The discoloration may occur due to the exposure of the base layer 12 as described above or a thermal change, e.g., a change resulting from oxidation.

For example, as shown in FIG. 3, the use-state indicating layer 13 in a region adjacent to the corner 9 assumes a temper color to form the discolored region 10. This results from an increase in temperature near the corner 9 due to cutting of the work piece with the corner 9.

Figure 4:
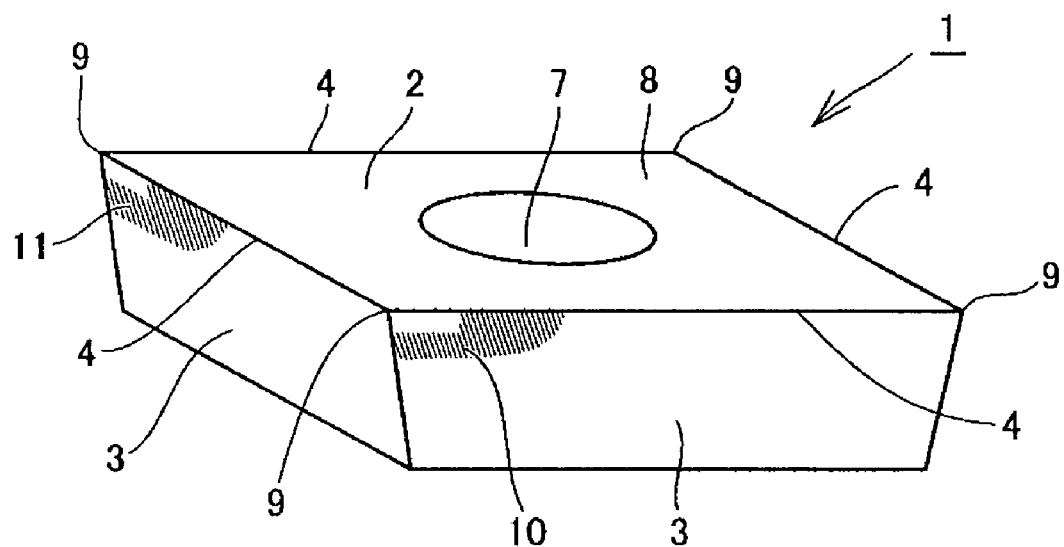
FIG. 4 is a schematic perspective view of an indexable cutting insert according to the present invention after the use of two edge lines (including a corner).

After the indexable cutting insert 1 is used for a long time (after the cutting position is changed), the appearance shown in FIG. 4 appears. Since the appearance shown in FIG. 3 appears immediately after a first cutting work for several minutes, the user can easily recognize that the corner 9 has been used, but another corner 9 is still unused. When another corner 9 has been used, the appearance shown in FIG. 4 occurs. In this case, the use-state indicating layer 13 in a region adjacent to the other corner 9 is discolored to form a discolored region 11, thereby showing that the other corner 9 has been used.

The indexable cutting insert 1 shown in FIGS. 2 to 4 is a throw-away indexable cutting insert having four usable corners 9. Which of a plurality of corners 9 has been used and which of the corners 9 is still unused can be determined from the color of the use-state indicating layer 13. Therefore, the maintenance of a cutting tool provided with the indexable cutting insert can be simplified.

As described above, the indexable cutting insert 1 has the composite coating 14 including the base layer 12 and the use-state indicating layer 13 (FIG. 5). The use-state indicating layer is formed in the region A2. However, in a general indexable cutting insert, e.g., ISO standard SNGN120408, the top or bottom surface serves as a face, while in an exceptional indexable cutting insert which is called a vertical indexable cutting insert, other than the above, the side surfaces serve as faces.

Even when the adjacent corner 9 is used for a shot time, clear traces remain in the use-state indicating layer 13, and the use-state indicating layer 13 is discolored or changed in quality. Since the use-state indicating layer 13 is very sensitive, an underlying layer or material (i.e., the base layer) of a different color appears in some cases. Therefore, a clear color contrast or brightness contrast occurs due to the function of the use-state indicating layer 13, thereby permitting the easy identification of the used corner. When a coating having low frictional resistance is provided on the entire surface or a portion of the region A2, the appearance and surface smoothness of the work piece is not impaired as compared with the case in which such a coating is provided on the region A1. It is thus found that it is particularly advantageous to use the entire surface or a portion of the region A2 as a use-state indicating surface.

EXAMPLES

The present invention will be described in further detail below with reference to examples, but the present invention is not limited to these examples.

Example 1

A cemented carbide powder with a composition containing 87.1% by weight of WC, 1.8% by weight of TiC, 2.0% by weight of TaC, 1.0% by weight of NbC, and 8.1% by weight of Co was pressed, sintered at 1400° C. for 1 hour in a vacuum atmosphere, and then subjected to smooth polishing and edge processing of edge lines with a SiC brush (horning of a width of 0.05 mm from the face side) to prepare a cemented carbide insert as a body having the same shape as a cutting insert CNMG120408N-UX (manufactured by Sumitomo Denko Hard Metal Co., Ltd.). The body had a beta-free layer of 16 μm formed on the surface thereof, two faces, and four flanks, each face and each flank being connected with an edge line (a hypothetical line because the edge processing had been performed) provided therebetween. The body had a total of eight edge lines. In addition, a point of intersection of two flanks and one face was a corner (a hypothetical point of intersection because the edge processing had been performed). The body had a total of eight corners.

Then, the layers described below were formed over the entire surface of the body by a known thermal CVD method. Namely, the body was coated with TiN of 0.5 μm, TiCN (formed by the MT-CVD method) of 4.6 μm, α-alumina (α-$Al_2O_3$) of 2.2 μm, and TiN of 0.5 μm serving as the outermost layer in that order from the surface side (total thickness of 7.8 μm). In the coating (Coating No. 1), TiN of 0.5 μm (the surface side of the body), TiCN of 4.6 μm, and α-alumina (α-$Al_2O_3$) of 2.2 μm formed a base layer, and TiN of 0.5 μm of the outermost layer formed a use-state indicating layer.

Similarly, the entire surface of the body was coated with each of Coating Nos. 2 to 6 shown in Table I instead of Coating No. 1.

TABLE I

| | | Coating | |
|---|---|---|---|
| No. | Base layer | Use-state indicating layer | Total thickness |
| 1 | TiN(0.5 μm)/TiCN(MT-CVD, 4.6 μm)/ α-Al$_2$O$_3$(2.2 μm) | TiN (0.5 μm) | 7.8 μm |
| 2 | TiC(0.4 μm)/TiCN(MT-CVD, 2.7 μm)/ κ-Al$_2$O$_3$(2.6 μm) | TiCN (0.4 μm) | 6.1 μm |
| 3 | TiN(0.3 μm)/TiCN(MT-CVD, 3.3 μm)/ TiCN(HT-CVD, 0.9 μm)/ TiBN(0.3 μm)/κ-Al$_2$O$_3$(1.9 μm) | TiN (0.4 μm) | 7.1 μm |
| 4 | TiN(0.5 μm)/ZrCN(3.5 μm)/ZrO$_2$(0.6 μm)/ α-Al$_2$O$_3$(2.2 μm) | ZrN (0.5 μm) | 7.3 μm |
| 5 | TiN(0.5 μm)/TiCN(MT-CVD, 5.6 μm)/ TiBN(0.9 μm)/α-Al$_2$O$_3$(5.2 μm) | TiN (0.4 μm) | 12.6 μm |
| 6 | TiN(0.5 μm)/TiCN(MT-CVD, 4.5 μm)/ α-Al$_2$O$_3$(2.1 μm) | CrN (0.4 μm) | 7.5 μm |

The layers shown in Table I were laminated on the surface of the body in the order from the left to form the base layer. Each of the layers excluding a CrN layer of Coating No. 6 was formed by a known thermal CVD method (MT-CVD represents the MT-CVD method (deposition temperature 900° C.), and HT-CVD represents the HT-CVD method (deposition temperature 1000° C.). The CrN layer was formed by an ion plating method.

Each of the bodies subjected to the coating was processed by 11 processing methods A to K below using a known blasting method (abrasive particles: alumina sand No. 120 (average particle diameter 100 μm), pressure: 0.3 MPa). In each of the processing methods, a portion where the use-state indicating layer was desired to remain was masked with a jig.

(Processing Method A)

The coating was not processed by the blasting method. Therefore, the surface of the body had the color of the use-state indicating layer (for example, in Coating No. 1, the color was a gold color of TiN).

(Processing Method B)

Figure 6:
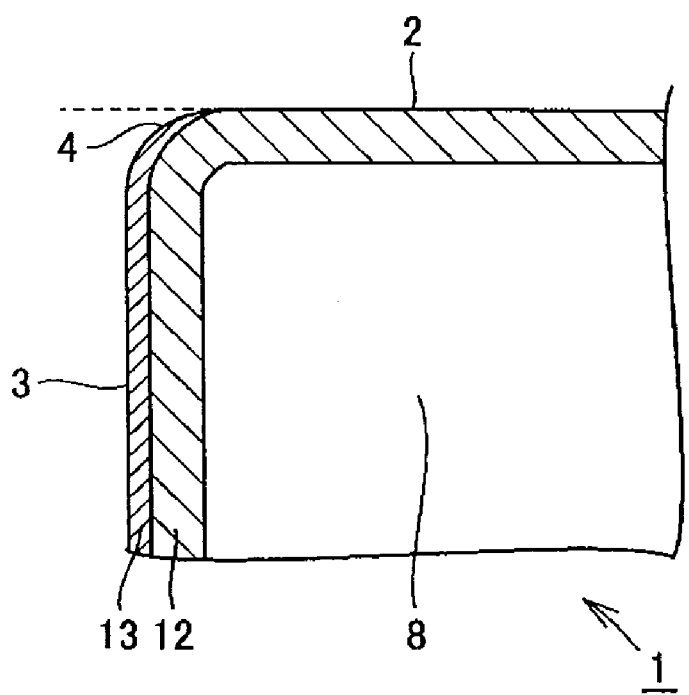
FIG. 6 is a sectional view of an indexable cutting insert including a use-state indicating layer formed over the entire surface of a flank.

The coating was processed by the blasting method to remove the use-state indicating layer in the faces. The entire surface of the flanks had the color of the use-state indicating layer (for example, in Coating No. 1, the color was a gold color of TiN), and the faces had the color of the base layer (for example, in Coating No. 1, the color was a black color of Al$_2$O$_3$) (refer to FIG. 6 in which the use-state indicating layer 13 is formed to extend to the flat portion of the face 2, but the use-state indicating layer 13 may be formed to stop short of the processed edge surface without extending to the flat portion. In other words, the processing method includes both the case in which the use-state indicating layer is formed in the edge processed surface of the edge line and the case in which the use-state indicating layer is not formed in the edge processed surface of the edge line, and both cases exhibit the same result).

(Processing Method C)

Figure 7:
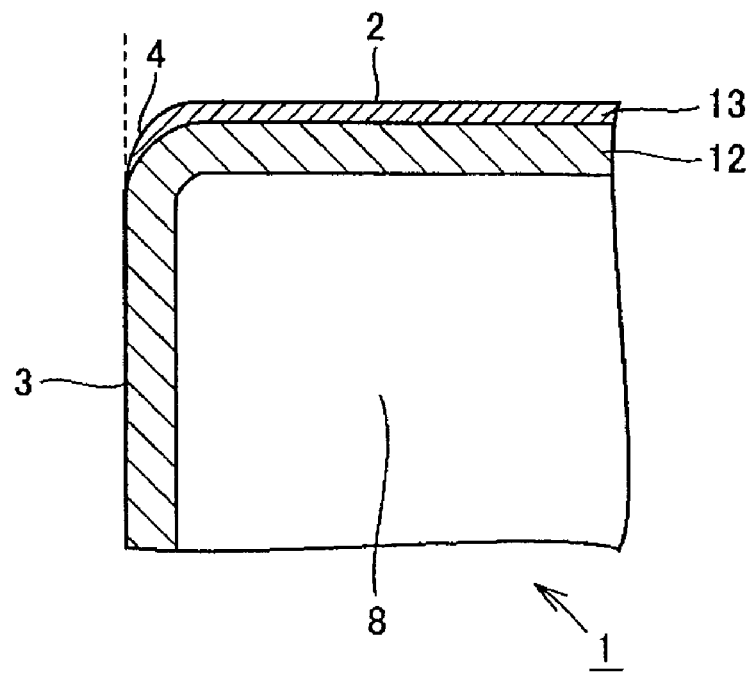
FIG. 7 is a sectional view of an indexable cutting insert including a use-state indicating layer formed over the entire surface of a face.

The coating was processed by the blasting method to remove the use-state indicating layer in the flanks. The entire surface of the faces had the color of the use-state indicating layer (for example, in Coating No. 1, the color was a gold color of TiN), and the flanks had the color of the base layer (for example, in Coating No. 1, the color was a black color of Al$_2$O$_3$) (refer to FIG. 7 in which the use-state indicating layer 13 is formed to extend to the flat portion of the flank 3, but the use-state indicating layer 13 may be formed to stop short of the processed edge surface without extending to the flat portion. In other words, the processing method includes both the case in which the use-state indicating layer is formed in the edge processed surface of the edge line and the case in which the use-state indicating layer is not formed in the edge processed surface of the edge line, and both cases exhibit the same result).

(Processing Method D)

Figure 8:
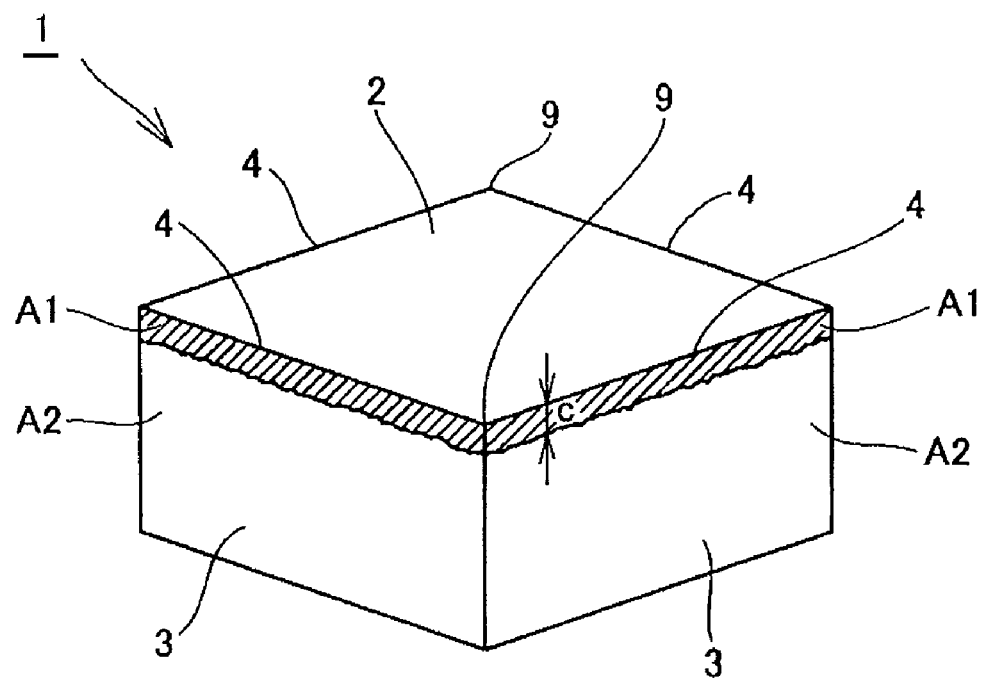
FIG. 8 is a schematic perspective view of an indexable cutting insert according to the present invention in which a region A1 is formed around the periphery of a body.

As shown in FIG. 8, the coating was processed by the blasting method to remove the use-state indicating layer from the face and the region A1 vertically extending in substantially parallel on the flanks to a distance c of 1.38 to 2.05 mm from the edge lines. The region A1 was continuously formed over the four flanks to extent around the body, included the four corners, and had an area of 64.1 mm$_2$. Therefore, the region A2 excluding the region A1 on the flanks had the color of the use-state indicating layer (for example, in Coating No. 1, the color was a gold color of TiN) because the use-state indicating layer was formed on the base layer, and the region A1 on the flanks and the face had the color of the base layer (for example, in Coating No. 1, the color was a black color of Al$_2$O$_3$) (FIG. 5).

The reason for specifying the distance c in the range of 1.38 to 2.05 mm from the edge lines was that it was difficult to keep the distance constant because of leakage of a blast in spite of masking with as high precision as possible, thereby causing an error. In a nose R section taken by dividing the angle of a corner into two halves, generally, the distance c at a center (referred to as a "R/2 position" hereinafter) was 1.45 mm. Although there is a plurality of R/2 positions, the distance is not the same at all R/2 positions, and the above value of the distance corresponds to one of the R/2 positions (this meaning applies to the processing methods E to J and the measurement of surface roughness).

The area was measured by observation with a magnification of 600 times using an electron microscope.

(Processing Method E)

The same processing method as the processing method D was performed except that the distance c from the edge lines in the vertical direction was 0.68 to 1.34 mm. The distance c at a R/2 position was 0.72 mm, and the area of the region A1 was 30.32 mm$^2$. The reason for specifying the distance c within a range is the same as in the processing method D.

(Processing Method F)

The same processing method as the processing method D was performed except that the distance c from the edge lines in the vertical direction was 0.35 to 0.58 mm. The distance c at a R/2 position was 0.50 mm, and the area of the region A1 was 4.18 mm$^2$. The reason for specifying the distance c within a range is the same as in the processing method D.

(Processing Method G)

The same processing method as the processing method D was performed except that the distance c from the edge lines in the vertical direction was 0.01 to 0.25 mm. The distance c at a R/2 position was 0.14 mm, and the area of the region A1 was 1.52 mm$^2$. The reason for specifying the distance c within a range is the same as in the processing method D.

(Processing Method H)

Figure 9:
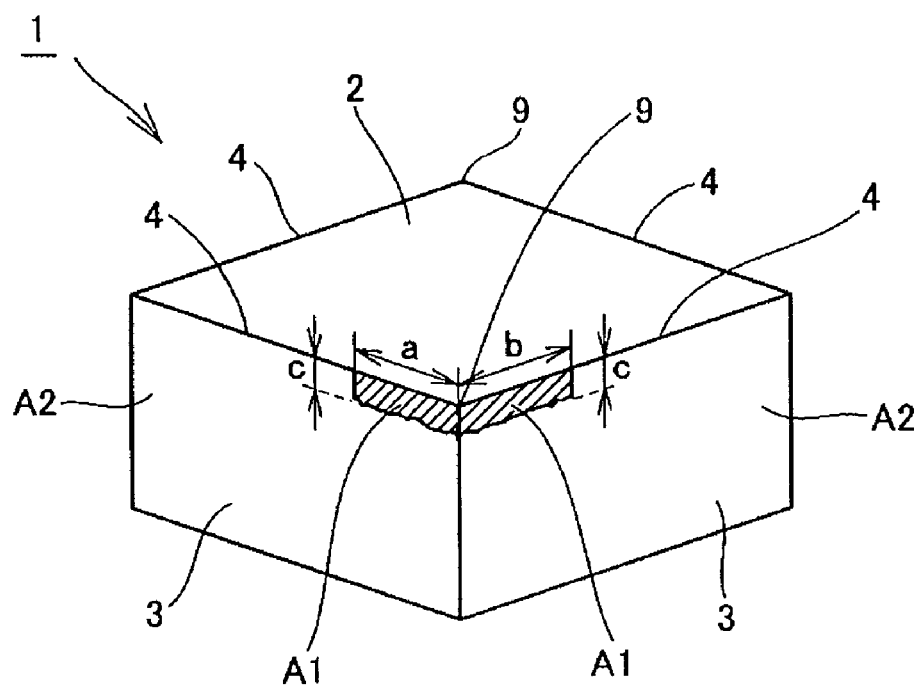
FIG. 9 is a schematic perspective view of an indexable cutting insert according to the present invention in which a region A1 is formed to extent over two flanks.

As shown in FIG. 9, the coating was processed by the blasting method to remove the use-state indicating layer from the face and the region A1 extending on the flanks to a distance c (0.4 to 1.02 mm) from the edge lines in the vertical direction and extending to distances a (2.7 mm) and b (2.8 mm) from one of the corners along the edge lines. The region A1 was formed continuously over the two flanks, included one corner, and had an area of 4.8 mm². Therefore, the region A2 excluding the region A1 on the flanks had the color of the use-state indicating layer (for example, in Coating No. 1, the color was a gold color of TiN) because the use-state indicating layer was formed on the base layer, and the region A1 on the flanks and the face had the color of the base layer (for example, in Coating No. 1, the color was a black color of $Al_2O_3$).

The reason for specifying the distance c in the range of 0.4 to 1.02 mm from the edge lines was that it was difficult to keep the distance constant because of the leakage of a blast in spite of masking with as high precision as possible, thereby causing an error. The distance c at a R/2 position was 0.58 mm.

(Processing Method I)

The same processing method as the processing method H was performed except that the distances a, b, and c were changed to 5.3 mm, 1.0 mm, and 1.01 to 1.43 mm, respectively. The distance c at a R/2 position was 1.21 mm, and the area of the region A1 was 10.2 mm². The reason for specifying the distance c within a range is the same as in the processing method H.

(Processing Method J)

The same processing method as the processing method H was performed except that the distances a, b, and c were changed to 0.9 mm, 1.0 mm, and 0.1 to 0.44 mm, respectively. The distance c at a R/2 position was 0.21 mm, and the area of the region A1 was 1.9 mm². The reason for specifying the distance c within a range is the same as in the processing method H.

(Processing Method K)

The coating was processed by the blast method to remove the use-stat indicating layer from the entire surface of the body. Therefore, the entire surface of the body (the face and the flanks) had the color of the base layer (for example, in Coating No. 1, the color was a black color of $Al_2O_3$).

As described above, 66 types of indexable cutting insert Nos. 1 to 66 shown in Tables II to IV below were produced. Nos. 4, 5, 6, 8, 9, 15, 16, 17, 19, 20, 26, 27, 28, 30, 31, 37, 38, 39, 41, 42, 48, 49, 50, 52, 53, 59, 60, 61, 63, and 64 were examples of the present invention, and the other Nos. were comparative examples.

A tuning test was conducted for each of indexable cutting insert Nos. 1 to 66 under the conditions below to measure the surface roughness of a work piece and an amount of flank wear of each indexable cutting insert. Also, welding of the cutting edge to the work piece, the state of the processed surface of the work piece, and identification of the use states of the edge lines (including the corners) were observed. The results are shown in Tables II to IV. A lower value of surface roughness (Rz: JIS B0601: 2001) of the work piece indicates high smoothness, and a smaller amount of flank wear indicates excellent wear resistance. Further, a larger amount of welding of the cutting edge to the work piece indicates lower surface roughness of the work piece, and a processed surface close to a mirror surface indicates that the work piece has an excellent processed surface.

(Conditions of Turning Test)
Work piece: SCM415
Cutting speed: 120 m/min
Feed: 0.13 mm/rev.
Cutting depth: 1.5 mm
Cutting oil: No
Cutting time: 30 min

TABLE II

| | Indexable cutting insert No. | Coating No. | Processing method | Amount of flank wear (mm) | Surface roughness of work piece Rz (μm) | Edge welding to work piece | State of processed surface of work piece | Identification of use state of edge line |
|---|---|---|---|---|---|---|---|---|
| | 1 | 1 | A | 0.155 | 5.3 | Large | Clouded | Easy |
| | 2 | 1 | B | 0.154 | 5.3 | Large | Clouded | Easy |
| | 3 | 1 | C | 0.130 | 3.2 | (Note 1) | (Note 2) | Easy |
| * | 4 | 1 | D | 0.100 | 2.2 | No | Close to mirror surface | Easy |
| * | 5 | 1 | E | 0.099 | 2.1 | No | Close to mirror surface | Easy |
| * | 6 | 1 | F | 0.098 | 2.0 | No | Close to mirror surface | Easy |
| | 7 | 1 | G | 0.131 | 3.3 | (Note 1) | (Note 2) | Easy |
| * | 8 | 1 | H | 0.100 | 2.2 | No | Close to mirror surface | Easy |
| * | 9 | 1 | I | 0.099 | 2.2 | No | Close to mirror surface | Easy |
| | 10 | 1 | J | 0.127 | 3.2 | (Note 1) | (Note 2) | Easy |
| | 11 | 1 | K | 0.098 | 2.1 | No | Close to mirror surface | Difficult |
| | 12 | 2 | A | 0.154 | 5.5 | Large | Clouded | Easy |
| | 13 | 2 | B | 0.153 | 5.4 | Large | Clouded | Easy |
| | 14 | 2 | C | 0.143 | 3.4 | (Note 1) | (Note 2) | Easy |
| * | 15 | 2 | D | 0.117 | 2.0 | No | Close to mirror surface | Easy |
| * | 16 | 2 | E | 0.116 | 2.1 | No | Close to mirror surface | Easy |
| * | 17 | 2 | F | 0.116 | 2.0 | No | Close to mirror surface | Easy |
| | 18 | 2 | G | 0.141 | 3.3 | (Note 1) | (Note 2) | Easy |
| * | 19 | 2 | H | 0.115 | 2.1 | No | Close to mirror surface | Easy |

TABLE II-continued

| | Indexable cutting insert No. | Coating No. | Processing method | Amount of flank wear (mm) | Surface roughness of work piece Rz (μm) | Edge welding to work piece | State of processed surface of work piece | Identification of use state of edge line |
|---|---|---|---|---|---|---|---|---|
| * | 20 | 2 | I | 0.114 | 2.0 | No | Close to mirror surface | Easy |
| | 21 | 2 | J | 0.138 | 3.1 | (Note 1) | (Note 2) | Easy |
| | 22 | 2 | K | 0.117 | 2.1 | No | Close to mirror surface | Difficult |

(Note 1) Slight welding to the face
(Note 2) Substantially close to a mirror surface

TABLE III

| | Indexable cutting insert No. | Coating No. | Processing mehtod | Amount of flank wear (mm) | Surface roughness of work piece Rz (μm) | Edge welding to work piece | State of processed surface of work piece | Identification of use state of edge line |
|---|---|---|---|---|---|---|---|---|
| | 23 | 3 | A | 0.139 | 6.4 | Large | Clouded | Easy |
| | 24 | 3 | B | 0.138 | 6.3 | Large | Clouded | Easy |
| | 25 | 3 | C | 0.125 | 4.1 | (Note 1) | (Note 2) | Easy |
| * | 26 | 3 | D | 0.094 | 3.0 | No | Close to mirror surface | Easy |
| * | 27 | 3 | E | 0.095 | 3.1 | No | Close to mirror surface | Easy |
| * | 28 | 3 | F | 0.095 | 3.1 | No | Close to mirror surface | Easy |
| | 29 | 3 | G | 0.126 | 4.0 | (Note 1) | (Note 2) | Easy |
| * | 30 | 3 | H | 0.095 | 3.0 | No | Close to mirror surface | Easy |
| * | 31 | 3 | I | 0.094 | 3.1 | No | Close to mirror surface | Easy |
| | 32 | 3 | J | 0.125 | 3.9 | (Note 1) | (Note 2) | Easy |
| | 33 | 3 | K | 0.094 | 3.0 | No | Close to mirror surface | Difficult |
| | 34 | 4 | A | 0.147 | 5.5 | Large | Clouded | Easy |
| | 35 | 4 | B | 0.146 | 5.6 | Large | Clouded | Easy |
| | 36 | 4 | C | 0.132 | 3.7 | (Note 1) | (Note 2) | Easy |
| * | 37 | 4 | D | 0.110 | 2.6 | No | Close to mirror surface | Easy |
| * | 38 | 4 | E | 0.111 | 2.6 | No | Close to mirror surface | Easy |
| * | 39 | 4 | F | 0.110 | 2.5 | No | Close to mirror surface | Easy |
| | 40 | 4 | G | 0.133 | 3.6 | (Note 1) | (Note 2) | Easy |
| * | 41 | 4 | H | 0.110 | 2.5 | No | Close to mirror surface | Easy |
| * | 42 | 4 | I | 0.111 | 2.5 | No | Close to mirror surface | Easy |
| | 43 | 4 | J | 0.131 | 3.5 | (Note 1) | (Note 2) | Easy |
| | 44 | 4 | K | 0.111 | 2.5 | No | Close to mirror surface | Difficult |

(Note 1) Slight welding to the face
(Note 2) Substantially close to a mirror surface

TABLE IV

| | Indexable cutting insert No. | Coating No. | Processing method | Amount of flank wear (mm) | Surface roughness of work piece Rz (μm) | Edge welding to work piece | State of processed surface of work piece | Identification of use state of edge line |
|---|---|---|---|---|---|---|---|---|
| | 45 | 5 | A | 0.094 | 5.7 | Large | Clouded | Easy |
| | 46 | 5 | B | 0.090 | 5.7 | Large | Clouded | Easy |
| | 47 | 5 | C | 0.088 | 3.3 | (Note 1) | (Note 2) | Easy |
| * | 48 | 5 | D | 0.051 | 2.4 | No | Close to mirror surface | Easy |
| * | 49 | 5 | E | 0.050 | 2.3 | No | Close to mirror surface | Easy |

TABLE IV-continued

|   | Indexable cutting insert No. | Coating No. | Processing method | Amount of flank wear (mm) | Surface roughness of work piece Rz (μm) | Edge welding to work piece | State of processed surface of work piece | Identification of use state of edge line |
|---|---|---|---|---|---|---|---|---|
| * | 50 | 5 | F | 0.051 | 2.4 | No | Close to mirror surface | Easy |
|   | 51 | 5 | G | 0.089 | 3.4 | (Note 1) | (Note 2) | Easy |
| * | 52 | 5 | H | 0.050 | 3.3 | No | Close to mirror surface | Easy |
| * | 53 | 5 | I | 0.049 | 3.6 | No | Close to mirror surface | Easy |
|   | 54 | 5 | J | 0.050 | 2.4 | (Note 1) | (Note 2) | Easy |
|   | 55 | 5 | K | 0.051 | 2.4 | No | Close to mirror surface | Difficult |
|   | 56 | 6 | A | 0.138 | 5.5 | Large | Clouded | Easy |
|   | 57 | 6 | B | 0.138 | 5.6 | Large | Clouded | Easy |
|   | 58 | 6 | C | 0.121 | 3.6 | (Note 1) | (Note 2) | Easy |
| * | 59 | 6 | D | 0.095 | 2.4 | No | Close to mirror surface | Easy |
| * | 60 | 6 | E | 0.095 | 2.3 | No | Close to mirror surface | Easy |
| * | 61 | 6 | F | 0.095 | 2.3 | No | Close to mirror surface | Easy |
|   | 62 | 6 | G | 0.119 | 3.5 | (Note 1) | (Note 2) | Easy |
| * | 63 | 6 | H | 0.095 | 2.3 | No | Close to mirror surface | Easy |
| * | 64 | 6 | I | 0.094 | 2.3 | No | Close to mirror surface | Easy |
|   | 65 | 6 | J | 0.118 | 3.6 | (Note 1) | (Note 2) | Easy |
|   | 66 | 6 | K | 0.094 | 2.4 | No | Close to mirror surface | Difficult |

(Note 1) Slight welding to the face
(Note 2) Substantially close to a mirror surface In Tables II to IV, the examples of the present invention are marked with "*". All the outermost layers of the base layers were black regardless of the type of the coating. In the use-state indicating layer, TiN was a gold color, ZrN was a platinum color, TiCN was a pink color, and CrN was a silver color.

Tables II to IV indicate that in the indexable cutting inserts of the examples of the present invention, the use states of the edge lines can be easily identified, thereby causing the excellent attention calling function. In addition, the cutting edge was not welded to the work piece, and the state of the work piece after cutting was close to a mirror surface and had excellent surface smoothness. When the surface roughness Ra of the region A1 is A μm, and the surface roughness Ra of the region A2 is B μm, all the indexable cutting inserts of the examples of the invention satisfy the relation, 0.8>A/B (measured by the same method as that described below for No. 5).

On the other hand, in the indexable cutting inserts of the comparative examples using processing method A or B, the use states of the cutting edge lines could be identified, but the cutting edge was greatly welded to the work piece to make the work piece cloudy after cutting and degrade the surface roughness of the work piece. In addition, in the indexable cutting inserts of the comparative examples using processing method C, the amount of welding to the work piece was significantly decreased, as compared with the indexable cutting inserts of the comparative examples using processing method A or B. However, welding slightly occurred on the face. In the indexable cutting inserts using processing method K, the work piece after cutting had an excellent state, but the determination of the use state of the edge line was difficult, thereby causing no attention calling function. In the indexable cutting inserts of the comparative examples using processing method G or J, welding of the cutting edge to the work piece was observed because the size of the region A1 in which the use-state indicating layer was removed was insufficient, and the state (surface gloss) of the processed surface of the work piece was inferior to the surface gloss of the work pieces processed by the indexable cutting inserts of the examples of the present invention.

The above-mentioned results reveal that the indexable cutting inserts of the examples of the present invention have an excellent effect in comparison to the indexable cutting insert of each comparative example. Although, in this example, an indexable cutting insert provided with a chip breaker was produced, the present invention is effective to an indexable cutting insert without a chip breaker.

Furthermore, indexable cutting insert Nos. 5-2, 5-3, 5-4, and 5-5 were produced by the same production method as for indexable cutting insert No. 5 except that the region A1 was processed by the blast method in a different degree of blasting (a different processing time and a different distance between the work piece (the indexable cutting insert) and a nozzle) to cause surface roughness Ra of the regions A1 and A2 as shown in Table V. The surface roughness Ra was measured with a laser microscope (VK-8510, manufactured by Keyence Co., Ltd.). The measurement position was the R/2 position. Namely, in the region A1, the measurement was performed at a point (i.e., the center of the region A1) at a distance of c/2 from the cutting edge line in the vertical direction, while in the region A2, the measurement was preformed at a point at a distance of c/2 from the boundary between the regions A1 and A2 to the regions A2 side in the vertical direction. The measurement distance was 100 μm.

A turning test was conducted for indexable cutting insert Nos. 5, 5-2, 5-3, 5-4, and 5-5 under the same conditions as described above to measure the surface roughness Rz of a work piece. The results are shown in Table V.

TABLE V

| Indexable cutting insert No. | Surface roughness Ra | | | Surface roughness of work piece (Rz) |
|---|---|---|---|---|
| | Region (A1) A μm | Region (A2) B μm | A/B | |
| 5 | 0.24 | 0.33 | 0.73 | 2.1 |
| 5-2 | 0.33 | 0.34 | 0.97 | 2.6 |
| 5-3 | 0.21 | 0.35 | 0.60 | 1.8 |
| 5-4 | 0.08 | 0.30 | 0.27 | 1.5 |
| 5-5 | 0.38 | 0.35 | 1.1 | 4.0 |

Table V reveals that when the values of surface roughness Ra of the regions A1 and A2 are A μm and B μm, respectively, the surface roughness Rz of the work piece is more improved as the value of A/B decreases.

These results show that in order to suppress welding between an indexable cutting insert and a work piece and prevent damage to the appearance of the work piece, it is effective to satisfy 1.0>A/B wherein A (μm) is the surface roughness Ra of the region A1 and B (μm) is the surface roughness Ra of the region A2, and more effective to decease the value of A/B to 0.8>A/B, preferably 0.6>A/B.

Further, indexable cutting inserts were produced by the same method as described above except that instead of CrN of Coating No. 6, metal Cr or metal Al was deposited to the same thickness by sputtering to form a use-state indicating layer. Also, the same processing and turning test as described above were conducted. As a result, it was found that the same results as indexable cutting insert Nos. 56 to 66 are obtained. The use-state indicating layer composed of metal Cr or metal Al has a silver color.

Example 2

A cemented carbide powder with a composition containing 88.3% by weight of WC, 1.7% by weight of TaC, and 10.0% by weight of Co was pressed, sintered at 1400° C. for 1 hour in a vacuum atmosphere, and then subjected to smooth polishing and edge processing of edge lines with a SiC brush (horning of a width of 0.05 mm from the face side) to prepare a cemented carbide insert as a body having the same shape as a cutting insert ISO model No. SPGN120408 (manufactured by Sumitomo Denko Hard Metal Co., Ltd.). The body had no beta-free layer formed on the surface thereof, one face, and four flanks, the face and each flank being connected with an edge line (a hypothetical line because the edge processing had been performed) provided therebetween. The body had a total of four edge lines. In addition, a point of intersection of two flanks and one face was a corner (a hypothetical point of intersection because the edge processing had been preformed). The body had a total of four corners. The thickness of the body was 3.18 mm.

Then, the layers below were formed over the entire surface of the body by a known thermal CVD method. Namely, the body was coated with TiN of 0.4 μm, TiCN (formed by the MT-CVD method) of 2.1 μm, α-alumina (α-$Al_2O_3$) of 2.1 μm, and TiN of 0.5 μm serving as the outermost layer in that order from the surface side (total thickness of 5.1 μm). In the coating (Coating No. 7), TiN of 0.4 μm (the surface side of the body), TiCN of 2.1 μm, and α-alumina (α-$Al_2O_3$) of 2.1 μm formed a base layer (black), and TiN of 0.5 μm of the outermost layer formed a use-state indicating layer (gold color).

Similarly, the entire surface of the body was coated with each of Coating Nos. 8 to 12 shown in Table VI instead of Coating No. 7.

TABLE VI

| | Coating | | |
|---|---|---|---|
| No. | Base layer | Use-state indicating layer | Total thickness |
| 7 | TiN(0.4 μm)/TiCN(MT-CVD, 2.1 μm)/α-$Al_2O_3$(2.1 μm) | TiN(0.5 μm) | 5.1 μm |
| 8 | TiC(0.4 μm)/TiCN(MT-CVD, 3.0 μm)/TiBN(0.5 μm)/κ-$Al_2O_3$(1.4 μm) | TiN(0.4 μm) | 5.7 μm |
| 9 | TiN(0.4 μm)/TiCN(MT-CVD, 4.5 μm)/$ZrO_2$(1.0 μm) | TiN(0.4 μm) | 6.3 μm |
| 10 | TiAlN(2.2 μm)/α-$Al_2O_3$(2.1 μm) | TiN(0.4 μm) | 4.7 μm |
| 11 | CrAlN(3.0 μm)/κ-$Al_2O_3$(1.4 μm) | TiCN(0.3 μm) | 4.7 μm |
| 12 | TiN(0.3 μm)/TiAlN(3.0 μm) | TiCN(0.2 μm) | 3.5 μm |

The layers shown in Table VI were laminated on the surface of the body in the order from the left to form the base layer. Like in Coating No. 7, in Coating Nos. 8 and 9, all layers were formed by a known thermal CVD method. In Coating Nos. 10 to 12, the layers were formed by a known PVD method.

Each of the bodies subjected to the coating was processed by one of the same processing methods A to C and K as in Example 1 and processing methods L to O described below to produce 48 types of indexable cutting insert Nos. 100 to 148. Nos. 104, 105, 107, 112, 113, 115, 120, 121, 123, 128, 129, 131, 136, 137, 139, 144, 145, and 147 were examples of the present invention, and the other Nos. were comparative examples.

(Processing Method L)

Figure 10:
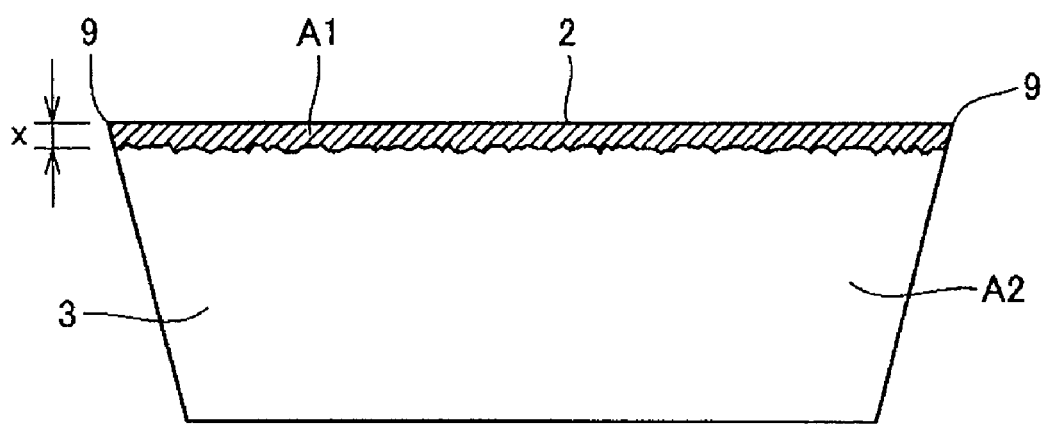
FIG. 10 is a schematic side view of an indexable cutting insert according to another embodiment of the present invention.

As shown in FIG. 10, the coating was processed by the blasting method to remove the use-state indicating layer from the face and the region A1 vertically extending in substantially parallel on the flanks to a distance x of 0.29 to 0.94 mm from the edge lines. The region A1 was continuously formed over the four flanks to extent around the body, included the four corners, and had an area of 33.4 $mm^2$ (the measurement method was the same as in Example 1 hereinafter). Therefore, the region A2 excluding the region A1 on the flanks had the color of the use-state indicating layer (for example, in Coating No. 7, the color was a gold color of TiN) because the use-state indicating layer was formed on the base layer, and the region A1 on the flanks and the face had the color of the base layer (for example, in Coating No. 7, the color was a black color of $Al_2O_3$) (FIG. 5).

The reason for specifying the distance x within the range of 0.29 to 0.94 mm from the edge lines was the same as in the processing method D of Example 1. The distance x at the R/2 position (the same as in Example 1) was 0.40 mm. Although there is a plurality of R/2 positions, the distance is not the same at all R/2 positions, and the above value of the distance corresponds to one of the R/2 positions as in Example 1 (this meaning applies to the processing methods M to O and the measurement of surface roughness).

(Processing Method M)

The same processing as the processing method L was performed except that the distance x from the edge lines in the vertical direction was 0.06 to 0.4 mm. The distance x at a R/2 position was 0.28 mm, and the area of the region A1 was 8.16 $mm^2$. The reason for specifying the distance x within a range is the same as in the processing method L.

(Processing Method N)

The same processing as the processing method L was performed except that the distance x from the edge lines in the vertical direction was 0.01 to 0.16 mm. The distance x at a R/2 position was 0.09 mm, and the area of the region A1 was 1.9 mm$^2$. The reason for specifying the distance x within a range is the same as in the processing method L.

(Processing Method O)

Figure 11:
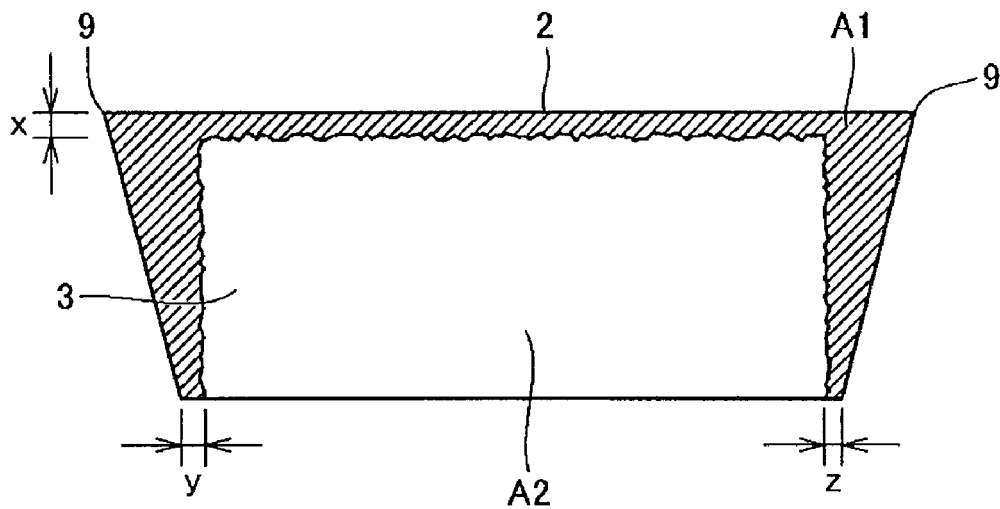
FIG. 11 is a schematic side view of an indexable cutting insert according to a further embodiment of the present invention.

As shown in FIG. 11, the coating was processed by the blasting method (under the same conditions as in the processing method L) to remove the use-state indicating layer from the face and the region A1 extending on the flanks to a distance x of 0.2 to 1.2 mm from the edge lines in the vertical direction and extending along the edge lines of intersection of the two flanks so that the distances y and z in a R/2 position were each 0.2 to 1.2 mm. The region A1 was formed continuously on the four flanks to extend around the body, included four corners at each of which the region A1 was formed to widen to a predetermined extent and extend along the edge of intersection of the two flanks, and had an area of 38.2 mm$^2$. Therefore, the region A2 excluding the region A1 on the flanks had the color of the use-state indicating layer (for example, in Coating No. 7, the color was a gold color of TiN) because the use-state indicating layer was formed on the base layer, and the region A1 on the flanks and the face had the color of the base layer (for example, in Coating No. 7, the color was a black color of $Al_2O_3$) (FIG. 5). The reason for specifying each of the distances x, y, and z within the range of 0.2 to 1.2 mm was the same as in the processing method L.

A milling test was conducted for each of indexable cutting insert Nos. 101 to 148 under the conditions below to measure the surface roughness of a work piece and an amount of flank wear of each indexable cutting insert. The results are shown in Tables VII and VIII. A lower value of surface roughness (Rz: JIS B0601: 2001) of the work piece indicates high smoothness, and a smaller amount of flank wear indicates excellent wear resistance.

(Conditions of Milling Test)
Work piece: FCD450
Cutting speed: 145 m/min
Feed: 0.28 mm/rev.
Cutting depth: 1.0 mm
Cutting oil: No
Cutting distance: 10 m
Cutter: DPG4160R (manufactured by Sumitomo Hard Metal Co., Ltd.

The cutter was provided with one indexable cutting insert. Therefore, the feed per turn of the cutter was the same as the feed of one cutting edge.

TABLE VII

| | Indexable cutting insert No. | Coating No. | Processing method | Amount of flank wear (mm) | Surface roughness of work piece Rz (μm) | Edge welding to work piece | State of processed surface of work piece | Identification of use state of edge line |
|---|---|---|---|---|---|---|---|---|
| | 101 | 7 | A | 0.112 | 9.3 | Large | Clouded | Easy |
| | 102 | 7 | B | 0.110 | 9.3 | Large | Clouded | Easy |
| | 103 | 7 | C | 0.093 | 7.2 | (Note 1) | (Note 2) | Easy |
| * | 104 | 7 | L | 0.068 | 5.6 | No | Close to mirror surface | Easy |
| * | 105 | 7 | M | 0.068 | 5.5 | No | Close to mirror surface | Easy |
| | 106 | 7 | N | 0.098 | 7.1 | (Note 1) | (Note 2) | Easy |
| * | 107 | 7 | O | 0.068 | 5.5 | No | Close to mirror surface | Easy |
| | 108 | 7 | K | 0.067 | 5.4 | No | Close to mirror surface | Difficult |
| | 109 | 8 | A | 0.127 | 9.4 | Large | Clouded | Easy |
| | 110 | 8 | B | 0.125 | 9.3 | Large | Clouded | Easy |
| | 111 | 8 | C | 0.115 | 6.8 | (Note 1) | (Note 2) | Easy |
| * | 112 | 8 | L | 0.080 | 5.5 | No | Close to mirror surface | Easy |
| * | 113 | 8 | M | 0.082 | 5.5 | No | Close to mirror surface | Easy |
| | 114 | 8 | N | 0.114 | 6.8 | (Note 1) | (Note 2) | Easy |
| * | 115 | 8 | O | 0.081 | 5.5 | No | Close to mirror surface | Easy |
| | 116 | 8 | K | 0.082 | 5.6 | No | Close to mirror surface | Difficult |
| | 117 | 9 | A | 0.124 | 9.4 | Large | Clouded | Easy |
| | 118 | 9 | B | 0.123 | 9.3 | Large | Clouded | Easy |
| | 119 | 9 | C | 0.110 | 7.9 | (Note 1) | (Note 2) | Easy |
| * | 120 | 9 | L | 0.071 | 5.2 | No | Close to mirror surface | Easy |
| * | 121 | 9 | M | 0.070 | 5.1 | No | Close to mirror surface | Easy |
| | 122 | 9 | N | 0.111 | 7.8 | (Note 1) | (Note 2) | Easy |
| * | 123 | 9 | O | 0.071 | 5.3 | No | Close to mirror surface | Easy |
| | 124 | 9 | K | 0.072 | 5.2 | No | Close to mirror surface | Difficult |

(Note 1) Slight welding to the face
(Note 2) Substantially close to a mirror surface

TABLE VIII

| Indexable cutting insert No. | Coating No. | Processing method | Amount of flank wear (mm) | Surface roughness of work piece Rz (μm) | Edge welding to work piece | State of processed surface of work piece | Identification of use state of edge line |
|---|---|---|---|---|---|---|---|
| 125 | 10 | A | 0.095 | 7.8 | Large | Clouded | Easy |
| 126 | 10 | B | 0.094 | 7.7 | Large | Clouded | Easy |
| 127 | 10 | C | 0.086 | 6.6 | (Note 1) | (Note 2) | Easy |
| * 128 | 10 | L | 0.051 | 4.9 | No | Close to mirror surface | Easy |
| * 129 | 10 | M | 0.052 | 5.0 | No | Close to mirror surface | Easy |
| 130 | 10 | N | 0.050 | 6.5 | (Note 1) | (Note 2) | Easy |
| * 131 | 10 | O | 0.087 | 5.0 | No | Close to mirror surface | Easy |
| 132 | 10 | K | 0.051 | 5.1 | No | Close to mirror surface | Difficult |
| 133 | 11 | A | 0.092 | 7.1 | Large | Clouded | Easy |
| 134 | 11 | B | 0.090 | 6.9 | Large | Clouded | Easy |
| 135 | 11 | C | 0.081 | 6.4 | (Note 1) | (Note 2) | Easy |
| * 136 | 11 | L | 0.059 | 5.4 | No | Close to mirror surface | Easy |
| * 137 | 11 | M | 0.059 | 5.4 | No | Close to mirror surface | Easy |
| 138 | 11 | N | 0.082 | 6.4 | (Note 1) | (Note 2) | Easy |
| * 139 | 11 | O | 0.060 | 5.3 | No | Close to mirror surface | Easy |
| 140 | 11 | K | 0.058 | 5.3 | No | Close to mirror surface | Difficult |
| 141 | 12 | A | 0.095 | 8.0 | Large | Clouded | Easy |
| 142 | 12 | B | 0.095 | 8.1 | Large | Clouded | Easy |
| 143 | 12 | C | 0.081 | 7.3 | (Note 1) | (Note 2) | Easy |
| * 144 | 12 | L | 0.053 | 5.1 | No | Close to mirror surface | Easy |
| * 145 | 12 | M | 0.055 | 4.8 | No | Close to mirror surface | Easy |
| 146 | 12 | N | 0.080 | 7.3 | (Note 1) | (Note 2) | Easy |
| * 147 | 12 | O | 0.054 | 4.9 | No | Close to mirror surface | Easy |
| 148 | 12 | K | 0.055 | 5.0 | No | Close to mirror surface | Difficult |

(Note 1) Slight welding to the face
(Note 2) Substantially close to a mirror surface In Tables VII and VIII, the examples of the present invention are marked with "*". All the outermost layers of the base layers were black regardless of the type of the coating. In the use-state indicating layer, TiN was a gold color, and TiCN was a pink color.

Tables VII and VIII indicate that in the indexable cutting inserts of the examples of the present invention, the use states of the edge lines (containing the corners) can be easily identified, thereby causing the excellent attention calling function. In addition, the cutting edge was not welded to the work piece, and the state of the work piece after cutting was close to a mirror surface and had excellent surface smoothness. When the surface roughness Ra of the region A1 is A μm, and the surface roughness Ra of the region A2 is B μm, all the indexable cutting inserts of the examples of the invention satisfy the relation, 0.8>A/B (measured by the same method as in Example 1 except that with respect to the measurement position of a sample using the processing method O, the measurement point at a R/2 position in the region A1 was at a distance x of 1.5 mm from the corner in the vertical direction, and the measurement point in the region A2 was at a distance of 0.7 mm from the boundary between the regions A1 and A2 to the region A2 side in the horizontal direction).

On the other hand, in the indexable cutting inserts of the comparative examples using processing method A or B, the use states of the cutting edge lines could be identified, but the cutting edge was welded in a large amount to the work piece to make the work piece cloudy after cutting and degrade the surface roughness of the work piece. In addition, in the indexable cutting inserts of the comparative examples using processing method C, the amount of welding to the work piece was significantly decreased, as compared with the indexable cutting inserts of the comparative examples using processing method A or B. However, welding slightly occurred on the face. In the indexable cutting inserts using processing method K, the work piece after cutting had an excellent state, but the determination of the use state of the edge line was difficult, thereby causing no attention calling function. In the indexable cutting inserts of the comparative examples using processing method N, welding of the cutting edge to the work piece was observed because the size of the region A1 in which the use-state indicating layer was removed was insufficient, and the state (surface gloss) of the processed surface of the work piece was inferior to the surface gloss of the work pieces processed by the indexable cutting inserts of the examples of the present invention.

The above-mentioned results reveal that the indexable cutting inserts of the examples of the present invention have an excellent effect in comparison to the indexable cutting insert of each comparative example.

Furthermore, indexable cutting insert Nos. 104-2, 104-3, 104-4, and 105-5 were produced by the same production method as for indexable cutting insert No. 104 except that the region A1 was processed by a different blast method under different blasting conditions (a different processing time and a different distance between the work piece (the indexable cutting insert) and a nozzle) to cause surface roughness Ra of the regions A1 and A2 as shown in Table IX. The surface roughness Ra was measured by the same method as in Example 1.

A milling test was conducted for the indexable cutting insert Nos. 104, 104-2, 104-3, 104-4, and 104-5 under the conditions described below to measure the surface roughness Rz of a work piece as described above. The results are shown in Table IX.

(Conditions of Milling Test)
 Work piece: SCM415
 Cutting speed: 220 m/min
 Feed: 0.28 mm/rev.
 Cutting depth: 1.0 mm
 Cutting oil: No
 Cutting distance: 0.1 m

TABLE IX

| Indexable cutting insert No. | Surface roughness Ra | | | Surface roughness of work piece (Rz) |
|---|---|---|---|---|
| | Region (A1) A μm | Region (A2) B μm | A/B | |
| 104 | 0.26 | 0.34 | 0.76 | 4.6 |
| 104-2 | 0.33 | 0.34 | 0.97 | 4.8 |
| 104-3 | 0.21 | 0.35 | 0.31 | 1.6 |
| 104-4 | 0.06 | 0.31 | 0.19 | 1.4 |
| 104-5 | 0.39 | 0.34 | 1.11 | 6.1 |

Table IX reveals that when the values of surface roughness Ra of the regions A1 and A2 are A μm and B μm, respectively, the surface roughness Rz of the work piece is more improved as the value of A/B decreases.

These results show that in order to suppress welding between an indexable cutting insert and a work piece and prevent damage to the appearance of the work piece, it is effective to satisfy 1.0>A/B wherein A (μm) is the surface roughness Ra of the region A1 and B (μm) is the surface roughness Ra of the region A2, and more effective to decease the value of A/B to 0.8>A/B, preferably 0.6>A/B.

Example 3

A cemented carbide powder with a composition containing 2.5% by weight of TiC, 1.0% by weight of TaC, 1.0% by weight of NbC, 7.5% by weight of Co, and the balance composed of WC was pressed, sintered at 1400° C. for 1 hour in a vacuum atmosphere, and then subjected to smooth polishing and edge processing of edge lines with a SiC brush (horning of a width of 0.05 mm from the face side) to prepare a cemented carbide insert as a body having the same shape as a cutting insert CNMG120408N-UX (manufactured by Sumitomo Denko Hard Metal Co., Ltd.). The body had a beta-free layer of 12 μm formed on the surface thereof, two faces, and four flanks, each face and each flank being connected with an edge line (a hypothetical line because the edge processing had been performed) provided therebetween. The body had a total of eight edge lines. In addition, a point of intersection of two flanks and one face was a corner (a hypothetical point of intersection because the edge processing had been preformed). The body had a total of eight corners.

Then, the layers below were formed over the entire surface of the body by a known thermal CVD method. Namely, the body was coated with TiN of 0.2 μm, TiCN (formed by the MT-CVD method) of 3.9 μm, κ-alumina (κ-Al$_2$O$_3$) of 2.5 μm, and TiN of 0.3 μm serving as the outermost layer in that order from the surface side of the body. In the coating (Coating No. 13), TiN of 0.2 μm (the surface side of the body), TiCN of 3.9 μm, and κ-alumina (κ-Al$_2$O$_3$) of 2.5 μm formed a base layer, and TiN of 0.3 μm of the outermost layer formed a use-state indicating layer.

Similarly, the entire surface of the body was coated with each of Coating Nos. 14 to 17 shown in Table X instead of Coating No. 13.

TABLE X

| | Coating | |
|---|---|---|
| No. | Base layer | Use-state indicating layer |
| 13 | TiN(0.2 μm)/TiCN(MT-CVD, 3.9 μm)/ κ-Al$_2$O$_3$(2.5 μm) | TiN(0.3 μm) |
| 14 | TiN(0.3 μm)/TiCN(MT-CVD, 8.8 μm)/ TiBN(0.5 μm)/α-Al$_2$O$_3$(4.9 μm) | TiN(0.3 μm) |
| 15 | TiC(0.5 μm)/TiCN(MT-CVD, 4.7 μm)/ TiC(2.0 μm)/α-Al$_2$O$_3$(2.6 μm) | ZrN(0.2 μm) |
| 16 | TiN(0.5 μm)/TiCN(MT-CVD, 3.2 μm)/ TiCN(HT-CVD, 1.3 μm)/TiBN(0.2 μm)/ α-Al$_2$O$_3$(3.5 μm) | TiCN(0.3 μm) |
| 17 | TiN(0.5 μm)/TiCN(MT-CVD, 4.5 μm)/ TiCNO(0.3 μm)/α-Al$_2$O$_3$(1.9 μm) | TiN(0.5 μm) |

In Coating No. 5, α-Al$_2$O$_3$ contained 0.21% by mass of Zr atoms, and TiCN (MT-CVD) contained 0.09% by mass of Zr atoms (confirmed by EPMA analysis).

The layers shown in Table X were laminated on the surface of the body in the order from the left of the table to form the base layer. All the layers were formed by a known thermal CVD method (MT-CVD represents the MT-CVD method (deposition temperature 900° C.), and HT-CVD represents the HT-CVD method (deposition temperature 1000° C.).

Each of the bodies subjected to the coating was processed by one of the processing methods A to K using a known wet blasting method (abrasive particle: alumina sand No. 120 (average particle diameter 100 μm), pressure: 0.2 MPa). In each of the processing methods, a portion where the use-state indicating layer was desired to remain was masked with a jig.

The processing methods A, B, C and K were the same as in Example 1, and the other processing methods were as follows.

(Processing Method D2)

As shown in FIG. 8, the coating was processed by the blasting method to remove the use-state indicating layer from the face and the region A1 vertically extending in substantially parallel to the edge lines on the flanks to a distance c of 1.35 to 2.07 mm from the edge lines. The region A1 was continuously formed over the four flanks to extent around the body, included the four corners, and had an area of 63.5 mm$_2$. Therefore, the region A2 excluding the region A1 on the flanks had the color of the use-state indicating layer (for example, in Coating No. 13, the color was a gold color of TiN) because the use-state indicating layer was formed on the base layer, and the region A1 on the flanks and the face had the color of the base layer (for example, in Coating No. 13, the color was a black color of Al$_2$O$_3$) (FIG. 5).

The reason for specifying the distance c within the range of 1.35 to 2.07 mm from the edge lines was that it was difficult to keep the distance constant because of leakage of a blast in spite of masking with as high precision as possible, thereby causing an error. At the R/2 position, the distance c was 1.43 mm. Although there is a plurality of R/2 positions, the distance is not the same at all R/2 positions, and the above value of the distance corresponds to one of the R/2 positions (this meaning applies to the processing methods E2 to J2 and the measurement of surface roughness).

The area was measured by observation with a magnification of 600 times using an electron microscope.

(Processing Method E2)

The same processing as the processing method D2 was performed except that the distance c from the edge lines in the vertical direction was 0.69 to 1.35 mm. The distance c at a R/2 position was 0.75 mm, and the area of the region A1 was 30.68 mm$^2$. The reason for specifying the distance c within a range is the same as in the processing method D2.

(Processing Method F2)

The same processing as the processing method D2 was performed except that the distance c from the edge lines in the vertical direction was 0.36 to 0.575 mm. The distance c at a R/2 position was 0.51 mm, and the area of the region A1 was 4.13 mm$^2$. The reason for specifying the distance c within a range is the same as in the processing method D2.

(Processing Method G2)

The same processing as the processing method D2 was performed except that the distance c from the edge lines in the vertical direction was 0.01 to 0.24 mm. The distance c at a R/2 position was 0.13 mm, and the area of the region A1 was 1.54 mm$^2$. The reason for specifying the distance c within a range is the same as in the processing method D2.

(Processing Method H2)

As shown in FIG. 9, the coating was processed by the blasting method to remove the use-state indicating layer from the face and the region A1 extending on the flanks to a distance c (0.2 to 1.04 mm) from the edge lines in the vertical direction and extending to distances a (2.6 mm) and b (2.9 mm) from one of the corners along the edge lines. The region A1 was formed continuously on the two flanks, included one corner, and had an area of 4.7 mm$^2$. Therefore, the region A2 excluding the region A1 on the flanks had the color of the use-state indicating layer (for example, in Coating No. 13, the color was a gold color of TiN) because the use-state indicating layer was formed on the base layer, and the region A1 on the flanks and the face had the color of the base layer (for example, in Coating No. 13, the color was a black color of $Al_2O_3$).

The reason for specifying the distance c within the range of 0.2 to 1.04 mm from the edge lines was that it was difficult to keep the distance constant because of leakage of a blast in spite of masking with as high precision as possible, thereby causing an error. The distance c at a R/2 position was 0.57 mm.

(Processing Method I2)

The same processing as the processing method H2 was performed except that the distances a, b, and c were changed to 5.2 mm, 1.1 mm, and 1.02 to 1.35 mm, respectively. The distance c at a R/2 position was 1.22 mm, and the area of the region A1 was 9.8 mm$^2$. The reason for specifying the distance c within a range is the same as in the processing method H2.

(Processing Method J2)

The same processing as the processing method H2 was performed except that the distances a, b, and c were changed to 0.8 mm, 1.0 mm, and 0.1 to 0.35 mm, respectively. The distance c at a R/2 position was 0.18 mm, and the area of the region A1 was 1.7 mm$^2$. The reason for specifying the distance c within a range is the same as in the processing method H2.

As described above, the 55 types of indexable cutting insert Nos. 201 to 255 shown in Tables XI to XIII were produced. In each of the tables, the examples of the present invention are marked with "*" in the left column, and the other Nos. are comparative examples. All the outermost layers of the base layers were black regardless of the type of the coating. In the use-state indicating layer, TiN was a gold color, ZrN was a platinum color, and TiCN was a pink color.

A continuous turning test was conducted for each of indexable cutting insert Nos. 201 to 255 under the conditions below to measure an amount of flank wear of each indexable cutting insert. Also, after cutting for 15 minutes, welding of the cutting edge to the work piece, the state of the processed surface of the work piece, and identification of the use states of the edge lines (including the corners) were observed. The results are shown in Tables XI to XIII. A smaller amount of flank wear indicates excellent wear resistance. Further, a larger amount of welding of the cutting edge to the work piece indicates higher surface roughness of the work piece, and a processed surface closer to a mirror surface indicates that the work piece has an excellent processed surface.

(Conditions of Continuous Turning Test)
Work piece: S35C round rod
Cutting speed: 240 m/min
Feed: 0.35 mm/rev.
Cutting depth: 2.0 mm
Cutting oil: water-soluble oil
Cutting time: 15 min

TABLE XI

| | Indexable cutting insert No. | Coating No. | Processing method | Residual stress (GPa) | Amount of flank wear (mm) | Edge welding to work piece | State of processed surface of work piece | Identification of use state of edge line |
|---|---|---|---|---|---|---|---|---|
| | 201 | 13 | A | 0.2 | 0.224 | Large | Clouded | Easy |
| | 202 | 13 | B | −0.2 | 0.220 | Large | Clouded | Easy |
| | 203 | 13 | C | 0.2 | 0.175 | (Note 1) | Slightly clouded | Easy |
| * | 204 | 13 | D2 | −0.2 | 0.123 | No | Close to mirror surface | Easy |
| * | 205 | 13 | E2 | −0.4 | 0.124 | No | Close to mirror surface | Easy |
| * | 206 | 13 | F2 | −0.3 | 0.122 | No | Close to mirror surface | Easy |
| | 207 | 13 | G2 | −0.3 | 0.169 | (Note 1) | Slightly clouded | Easy |

TABLE XI-continued

|   | Indexable cutting insert No. | Coating No. | Processing method | Residual stress (GPa) | Amount of flank wear (mm) | Edge welding to work piece | State of processed surface of work piece | Identification of use state of edge line |
|---|---|---|---|---|---|---|---|---|
| * | 208 | 13 | H2 | −0.4 | 0.121 | No | Close to mirror surface | Easy |
| * | 209 | 13 | I2 | −0.3 | 0.122 | NO | Close to mirror surface | Easy |
|   | 210 | 13 | J2 | −0.4 | 0.171 | (Note 1) | Slightly clouded | Easy |
|   | 211 | 13 | K | −0.3 | 0.122 | No | Close to mirror surface | Difficult |
|   | 212 | 14 | A | 0.3 | 0.154 | Large | Clouded | Easy |
|   | 213 | 14 | B | −0.2 | 0.150 | Large | Clouded | Easy |
|   | 214 | 14 | C | 0.3 | 0.135 | (Note 1) | Slightly clouded | Easy |
| * | 215 | 14 | D2 | −0.2 | 0.093 | No | Close to mirror surface | Easy |
| * | 216 | 14 | E2 | −0.3 | 0.095 | No | Close to mirror surface | Easy |
| * | 217 | 14 | F2 | −0.2 | 0.094 | No | Close to mirror surface | Easy |
|   | 218 | 14 | G2 | −0.3 | 0.134 | (Note 1) | Slightly clouded | Easy |
| * | 219 | 14 | H2 | −0.3 | 0.095 | No | Close to mirror surface | Easy |
| * | 220 | 14 | I2 | −0.3 | 0.094 | No | Close to mirror surface | Easy |
|   | 221 | 14 | J2 | −0.4 | 0.133 | (Note 1) | Slightly clouded | Easy |
|   | 222 | 14 | K | −0.3 | 0.095 | No | Close to mirror surface | Difficult |

(Note 1) Slight welding to the face

TABLE XII

|   | Indexable cutting insert No. | Coating No. | Processing method | Residual stress (GPa) | Amount of flank wear (mm) | Edge welding to work piece | State of processed surface of work piece | Identification of use state of edge line |
|---|---|---|---|---|---|---|---|---|
|   | 223 | 15 | A | 0.3 | 0.165 | Large | Clouded | Easy |
|   | 224 | 15 | B | −0.1 | 0.161 | Large | Clouded | Easy |
|   | 225 | 15 | C | 0.3 | 0.144 | (Note 1) | Slightly clouded | Easy |
| * | 226 | 15 | D2 | −0.1 | 0.102 | No | Close to mirror surface | Easy |
| * | 227 | 15 | E2 | −0.5 | 0.102 | No | Close to mirror surface | Easy |
| * | 228 | 15 | F2 | −0.4 | 0.103 | No | Close to mirror surface | Easy |
|   | 229 | 15 | G2 | −0.4 | 0.146 | (Note 1) | Slightly clouded | Easy |
| * | 230 | 15 | H2 | −0.5 | 0.104 | No | Close to mirror surface | Easy |
| * | 231 | 15 | I2 | −0.3 | 0.105 | No | Close to mirror surface | Easy |
|   | 232 | 15 | J2 | −0.5 | 0.146 | (Note 1) | Slightly clouded | Easy |
|   | 233 | 15 | K | −0.4 | 0.105 | No | Close to mirror surface | Difficult |
|   | 234 | 16 | A | 0.2 | 0.177 | Large | Clouded | Easy |
|   | 235 | 16 | B | −0.1 | 0.176 | Large | Clouded | Easy |
|   | 236 | 16 | C | 0.2 | 0.166 | (Note 1) | Slightly clouded | Easy |
| * | 237 | 16 | D2 | −0.3 | 0.124 | No | Close to mirror surface | Easy |
| * | 238 | 16 | E2 | −0.5 | 0.123 | No | Close to mirror surface | Easy |
| * | 239 | 16 | F2 | −0.4 | 0.123 | No | Close to mirror surface | Easy |
|   | 240 | 16 | G2 | −0.4 | 0.168 | (Note 1) | Slightly clouded | Easy |
| * | 241 | 16 | H2 | −0.5 | 0.125 | No | Close to mirror surface | Easy |

TABLE XII-continued

| Indexable cutting insert No. | Coating No. | Processing method | Residual stress (GPa) | Amount of flank wear (mm) | Edge welding to work piece | State of processed surface of work piece | Identification of use state of edge line |
|---|---|---|---|---|---|---|---|
| * 242 | 16 | I2 | −0.3 | 0.124 | No | Close to mirror surface | Easy |
| 243 | 16 | J2 | −0.5 | 0.169 | (Note 1) | Slightly clouded | Easy |
| 244 | 16 | K | −0.4 | 0.123 | No | Close to mirror surface | Difficult |

(Note 1) Slight welding to the face

TABLE XIII

| Indexable cutting insert No. | Coating No. | Processing method | Residual stress (GPa) | Amount of flank wear (mm) | Edge welding to work piece | State of processed surface of work piece | Identification of use state of edge line |
|---|---|---|---|---|---|---|---|
| 245 | 17 | A | 0.4 | 0.192 | Large | Clouded | Easy |
| 246 | 17 | B | −0.1 | 0.195 | Large | Clouded | Easy |
| 247 | 17 | C | 0.4 | 0.188 | (Note 1) | Slightly clouded | Easy |
| * 248 | 17 | D2 | −0.3 | 0.143 | No | Close to mirror surface | Easy |
| * 249 | 17 | E2 | −0.5 | 0.144 | No | Close to mirror surface | Easy |
| * 250 | 17 | F2 | −0.4 | 0.142 | No | Close to mirror surface | Easy |
| 251 | 17 | G2 | −0.4 | 0.186 | (Note 1) | Slightly clouded | Easy |
| * 252 | 17 | H2 | −0.5 | 0.144 | No | Close to mirror surface | Easy |
| * 253 | 17 | I2 | −0.4 | 0.145 | No | Close to mirror surface | Easy |
| 254 | 17 | J2 | −0.6 | 0.191 | (Note 1) | Slightly clouded | Easy |
| 255 | 17 | K | −0.4 | 0.145 | No | Close to mirror surface | Difficult |

(Note 1) Slight welding to the face

Figure 12:
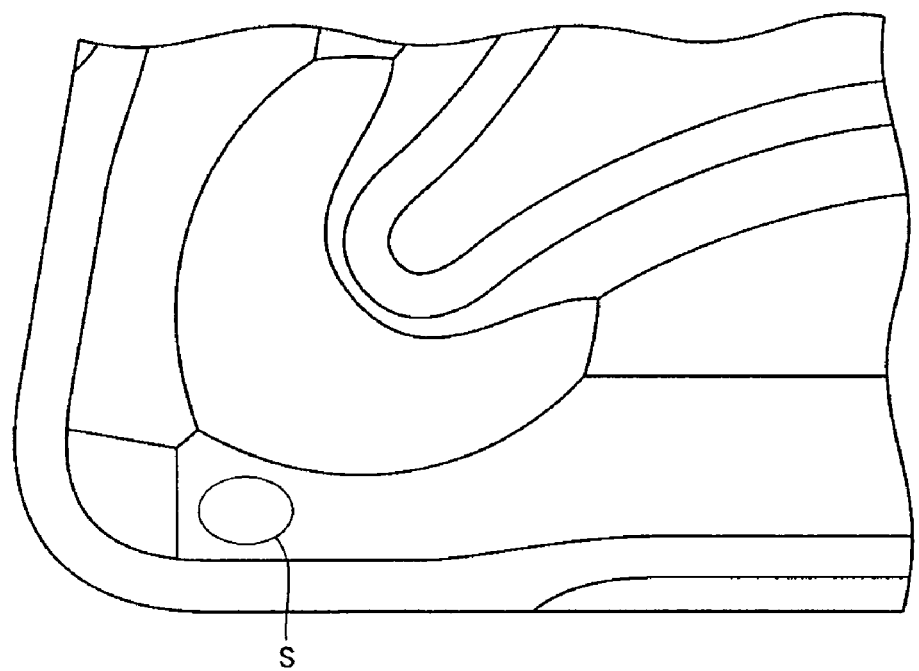
FIG. 12 is a schematic plan view showing one of the acute corners of an indexable cutting insert according to the present invention.

In Tables XII to XIII, the residual stress was measured at a spot S (positioned in a flat surface and having a diameter of 0.5 mm as viewed from the vertical direction of the flat surface) shown in FIG. 12 (a schematic enlarged plan view of the vicinity of a corner of a face of an indexable cutting insert of this example). Since there were four spots S at the respective corners of a face, an average of the values at the four spots was considered as the residual stress. Specifically, the $\sin^2 \phi$ method using an X-ray stress measuring apparatus was used as a measurement method, and in a sample coated with coating No. 13, the $\kappa\text{-Al}_2\text{O}_3$ layer was measured, while in a sample coated with any one of coating Nos. 14 to 17, $\alpha\text{-Al}_2\text{O}_3$ layer was measured (both in the examples and the comparative examples).

The measurement region (the spot S shown in FIG. 12) is a region involved in cutting with the face. In any one of the examples, the base layer is exposed from the surface in this region, and residual stress of the uppermost layer of the base layer is measured.

Tables XI to XIII indicate that in the indexable cutting inserts of the examples of the present invention, the use states of the edge lines can be easily identified, thereby causing the excellent attention calling function. In addition, the cutting edge was not welded to the work piece, and the state of the work piece after cutting was close to a mirror surface.

On the other hand, in the indexable cutting inserts of the comparative examples using processing method A or B, the use states of the cutting edge lines could be identified, but the cutting edge was welded in a large amount to the work piece to make the work piece cloudy after cutting. In addition, in the indexable cutting inserts of the comparative examples using processing method C, the amount of welding to the work piece was significantly decreased, as compared with the indexable cutting inserts of the comparative examples using processing method A or B. However, welding slightly occurred on the face. In the indexable cutting inserts using processing method K, the work piece after cutting had an excellent state, but the determination of the use state of the edge line was difficult, thereby causing no attention calling function. In the indexable cutting inserts of the comparative examples using processing method G2 or J2, welding of the cutting edge to the work piece was observed because the size of the region A1 in which the use-state indicating layer was removed was insufficient, and the state (surface gloss) of the processed surface of the work piece was inferior to the surface gloss of the work pieces processed by the indexable cutting inserts of the examples of the present invention.

The above-mentioned results reveal that the indexable cutting inserts of the examples of the present invention have an excellent effect in comparison to the indexable cutting insert of each comparative example.

Furthermore, indexable cutting insert Nos. 215-2 to 215-5 were produced by the same production method as for indexable cutting insert No. 215 except that the region A1 is processed by a different blasting method under different blasting conditions (a different processing time and a different distance between the work piece (the indexable cutting insert) and a nozzle) or by the brushing method (using #800 SiC brush) instead of the blasting method. Namely, the indexable cutting insert Nos. 215 and 215-2 to 215-5 have different residual stresses in each of the regions A1 and the faces. The residual stress was measured by the same method as described above (i.e., the spot S shown in FIG. 12 is a measurement region). The results are shown in Table XIV.

Similarly, a different residual stress was imparted to each of the region A1 and the face of indexable cutting insert Nos. 219, 249, and 253 to produce indexable cutting inserts (Nos. 219-2, 249-2 to 249-5, and 253-2) shown in Table XIV below.

Further, a continuous turning test was conducted for these indexable cutting inserts (including Nos. 215, 219, 249, and 253), and indexable cutting insert Nos. 212 and 245 of the comparative examples (the residual stress was measured for Nos. 212, 215, 219, 245, 249, and 253 by the same method as described above) under the same conditions as described above to measure an amount of flank wear. Furthermore, an intermittent turning test was conducted under the conditions below to measure a rate of edge defect (represented by a percentage of the number of defected corners relative to a total of 20 cutting edges (corners) measured). The results are shown in Table XIV below. A lower rate of edge defect indicates excellent toughness (defect resistance).

(Conditions of Intermittent Turning Test)
Work piece: SCM440 (round rod having four grooves)
Cutting speed: 95 m/min
Cutting depth: 2.0 mm
Feed: 0.42 mm/rev.
Wet/dry: dry
Cutting time: 1 min

TABLE XIV

| Indexable cutting insert No. | Residual stress (GPa) | Amount of flank wear (mm) | Rate of edge defect (%) |
|---|---|---|---|
| 212 | 0.3 | 0.154 | 100 |
| * 215 | −0.2 | 0.093 | 65 |
| * 215-2 | 0.1 | 0.095 | 75 |
| * 215-3 | −0.8 | 0.090 | 55 |
| * 215-4 | −1.8 | 0.088 | 40 |
| * 215-5 | −2.6 | 0.084 | 25 |
| * 219 | −0.3 | 0.095 | 65 |
| * 219-2 | −0.9 | 0.093 | 55 |
| 245 | 0.4 | 0.192 | 85 |
| * 249 | −0.5 | 0.144 | 50 |
| * 249-2 | 0.0 | 0.147 | 65 |
| * 249-3 | −0.7 | 0.140 | 40 |
| * 249-4 | −1.4 | 0.135 | 20 |
| * 249-5 | −3.2 | 0.131 | 5 |
| * 253 | −0.4 | 0.145 | 45 |
| * 253-2 | −1.1 | 0.139 | 30 |

Table XIV reveals that when at least one of the layers constituting the base layer has compressive residual stress in the region A1 or a portion of at least one of the regions involved in cutting with the face, excellent toughness is exhibited. In addition, more excellent toughness is exhibited as the compressive residual stress increases.

In Table XIV, the examples of the present invention are marked with "*". In each of the examples, the cutting edge was not welded to the work piece, and the work piece had an excellent glossy surface. However, in each of the comparative examples, the cutting edge was significantly welded to the work piece, and the processed surface of the work piece had no gloss.

In addition, indexable cutting insert Nos. 215-2 and 249-2 had the effect of decreasing the amount of flank wear, preventing welding to the work piece, or improving the gloss of the work piece processed surface, but toughness was not improved. In other words, it was found that the effect of improving toughness of a cutting edge of an indexable cutting insert can be obtained to some extent by preventing welding to the work piece, but the toughness of the cutting edge can be significantly improved by imparting compressive residual stress to a specified portion of the edge as described above.

The above-mentioned results reveal that the indexable cutting inserts of the examples of the present invention have an excellent effect in comparison to the indexable cutting insert of each comparative example.

Furthermore, indexable cutting insert Nos. 249-6, 249-7, 249-8, and 249-9 (examples of the present invention) were produced by the same production method as for indexable cutting insert No. 249 except that the region A1 was processed by the blasting method in a different degree of blasting (a different processing time and a different distance between the work piece (the indexable cutting insert) and a nozzle) to cause surface roughness Ra of the regions A1 and A2 as shown in Table XV. The surface roughness Ra was measured with a laser microscope (VK-8510, manufactured by Keyence Co., Ltd.). The measurement position was the R/2 position. Namely, in the region A1, the measurement was performed at a point (i.e., the center of the region A1) at a distance of c/2 from the cutting edge line in the vertical direction, while in the region A2, the measurement was performed at a point at a distance of c/2 from the boundary between the regions A1 and A2 to the regions A2 side in the vertical direction. The measurement distance was 100 μm. The residual stress was measured by the same method as described above (at the sports S shown in FIG. 12 positioned in measurement regions).

A continuous turning test was conducted for indexable cutting insert Nos. 249, 249-6, 249-7, 249-8, and 249-9 under the same conditions as described above to measure the surface roughness Rz (JIS B0601: 2001) of a work piece 1 minute after the start of the test by the same method as in Example 1 and measure the amount of flank wear and the rate of edge defect (by an intermittent turning test) by the same method as described above. The results are shown in Table XV.

TABLE XV

| Indexable cutting insert No. | Residual stress (GPa) | Surface roughness Ra | | | Surface roughness of work piece (Rz) | Amount of flank wear (mm) | Rate of edge defect (%) |
| | | Region (A1) A μm | Region (A2) B μm | A/B | | | |
|---|---|---|---|---|---|---|---|
| 249 | −0.5 | 0.25 | 0.32 | 0.78 | 2.2 | 0.144 | 50 |
| 249-6 | 0.1 | 0.29 | 0.31 | 0.94 | 2.7 | 0.148 | 70 |
| 249-7 | −0.4 | 0.21 | 0.31 | 0.68 | 2.1 | 0.142 | 45 |

TABLE XV-continued

| Indexable cutting insert No. | Residual stress (GPa) | Surface roughness Ra | | A/B | Surface roughness of work piece (Rz) | Amount of flank wear (mm) | Rate of edge defect (%) |
|---|---|---|---|---|---|---|---|
| | | Region (A1) A μm | Region (A2) B μm | | | | |
| 249-8 | −1.0 | 0.18 | 0.31 | 0.58 | 2.0 | 0.137 | 25 |
| 249-9 | −2.6 | 0.15 | 0.30 | 0.50 | 1.9 | 0.132 | 10 |

Table XV reveals that when the surface roughness Ra of the region A1 and the surface roughness Ra of the region A2 are A (μm) and B (μm), respectively, the surface roughness Rz of the work piece is more improved as the value of A/B decreases.

These results show that in order to suppress welding between an indexable cutting insert and a work piece and prevent damage to the appearance of the work piece, it is effective to satisfy 1.0>A/B wherein A (μm) and B (μm) are the surface roughness of the regions A1 and A2, respectively, and more effective to decease the value of A/B to 0.8>A/B, preferably 0.6>A/B.

Furthermore, a good rate of edge defect is exhibited as the compressive residual stress applied increases.

Although, in this example, an indexable cutting insert provided with a chip breaker was produced, the present invention is effective for an indexable cutting insert without a chip breaker.

Example 4

A cemented carbide powder with a composition containing 0.5% by weight of TaC, 10.0% by weight of Co, and the balance composed of WC was pressed, sintered at 1400° C. for 1 hour in a vacuum atmosphere, and then subjected to smooth polishing and edge processing of edge lines with a SiC brush (horning of a width of 0.05 mm from the face side) to prepare a cemented carbide insert as a body having the same shape as a cutting insert SEMT13T3AGSN-G (manufactured by Sumitomo Denko Hard Metal Co., Ltd.). The body had no beta-free layer formed on the surface thereof, one face, and four flanks, the face and each flank being connected with an edge line (a hypothetical line because the edge processing had been performed) provided therebetween. The body had a total of four edge lines. In addition, a point of intersection of two flanks and one face was a corner (a hypothetical point of intersection because the edge processing had been preformed). The body had a total of four corners.

Then, the layers below were formed over the entire surface of the body by a known thermal CVD method. Namely, the body was coated with TiN of 0.3 μm, TiCN (formed by the MT-CVD method) of 3.1 μm, κ-alumina (κ-Al$_2$O$_3$) of 1.4 μm, and TiN of 0.3 μm serving as the outermost layer in that order from the surface side. In the coating (Coating No. 18), TiN of 0.3 μm (the surface side of the body), TiCN of 3.1 μm, and κ-alumina (κ-Al$_2$O$_3$) of 1.4 μm formed a base layer (black), and TiN of 0.3 μm of the outermost layer formed a use-state indicating layer.

Similarly, the entire surface of the body was coated with each of Coating Nos. 19 to 22 shown in Table XVI instead of Coating No. 18.

TABLE XVI

| | Coating | |
|---|---|---|
| No. | Base layer | Use-state indicating layer |
| 18 | TiN(0.3 μm)/TiCN(MT-CVD, 3.1 μm)/ κ-Al$_2$O$_3$(1.4 μm) | TiN(0.3 μm) |
| 19 | TiN(0.3 μm)/TiCN(MT-CVD, 1.9 μm)/ TiC(0.8 μm)/TiN(0.3 μm)/α-Al$_2$O$_3$(2.0 μm) | TiCN(0.4 μm) |
| 20 | TiC(0.3 μm)/TiCN(MT-CVD, 2.5 μm)/ α-Al$_2$O$_3$(2.4 μm) | ZrN(0.5 μm) |
| 21 | TiN(0.3 μm)/TiCN(MT-CVD, 4.2 μm)/ TiCN(HT-CVD, 1.0 μm)/TiBN(0.3 μm)/ α-Al$_2$O$_3$(3.2 μm) | TiN(0.3 μm) |
| 22 | TiN(0.5 μm)/TiCN(MT-CVD, 6.1 μm)/ TiCNO(0.2 μm)/ α-Al$_2$O$_3$(4.0 μm) | TiN(0.5 μm) |

In Coating No. 20, α-Al$_2$O$_3$ contained 0.23% by mass of Zr atoms, and TiCN (MT-CVD) contained 0.10% by mass of Zr atoms (confirmed by EPMA analysis).

The layers shown in Table XVI were deposited on the surface of the body in the order from the left of the table to form the base layer. All the layers were formed by a known thermal CVD method (MT-CVD represents the MT-CVD method (deposition temperature 900° C.), and HT-CVD represents the HT-CVD method (deposition temperature 1000° C.).

Each of the bodies subjected to the coating was processed by one of the eight processing methods described below using a known wet blasting method (abrasive particle: alumina sand No. 120 (average particle diameter 100 μm), pressure: 0.2 MPa). In each of the processing methods, a portion where the use-state indicating layer was desired to remain was masked with a jig.

Processing methods A, B, C, and K were the same as in Example 1, and the other processing methods were as follows:

(Processing Method L2)

As shown in FIG. 10, the coating was processed by the blasting method (under the same conditions as in Example 1) to remove the use-state indicating layer from the face and the region A1 vertically extending in substantially parallel to the edge lines on the flanks to a distance x of 0.28 to 0.93 mm from the edge lines. The region A1 was continuously formed over the four flanks to extent around the body, included the four corners, and had an area of 33.1 mm$^2$ (the measurement method was the same as in Example 1 hereinafter). Therefore, the region A2 excluding the region A1 on the flanks had the color of the use-state indicating layer (for example, in Coating No. 18, the color was a gold color of TiN) because the use-state indicating layer was formed on the base layer, and the region A1 on the flanks and the face had the color of the base layer (for example, in Coating No. 18, the color was a black color of Al$_2$O$_3$) (FIG. 5).

The reason for specifying the distance x in the range of 0.28 to 0.93 mm from the edge lines was the same as in the processing method D of Example 1. The distance x at the R/2 position (the same as in Example 1) was 0.39 mm. Although there is a plurality of R/2 positions, the distance is not the same at all R/2 positions, and the above value of the distance corresponds to one of the R/2 positions as in Example 1 (this meaning applies to the processing methods M2 to O2).

(Processing Method M2)

The same processing as the processing method L2 was performed except that the distance x from the edge lines in the vertical direction was 0.05 to 0.41 mm. The distance x at a R/2 position was 0.27 mm, and the area of the region A1 was 8.15 mm$^2$. The reason for specifying the distance x within a range is the same as in the processing method L2.

(Processing Method N2)

The same processing as the processing method L2 was performed except that the distance x from the edge lines in the vertical direction was 0.01 to 0.17 mm. The distance x at a R/2 position was 0.09 mm, and the area of the region A1 was 1.8 mm$^2$. The reason for specifying the distance x within a range is the same as in the processing method L2.

(Processing Method O2)

As shown in FIG. 11, the coating was processed by the blasting method (the same conditions as in the processing method L2) to remove the use-state indicating layer from the face and the region A1 extending in substantially parallel to the edge lines on the flanks to a distance x of 0.2 to 1.3 mm from the edge lines in the vertical direction and extending along the edge of intersection of the two flanks so that in a R/2 position, the distances y and z were each 0.2 to 1.3 mm. The region A1 was formed continuously on the four flanks to extend along the edge lines around the body, included four corners at each of which the region A1 was formed to widen to a predetermined extent and extend along the edge of intersection of the two flanks, and had an area of 38.1 mm$^2$. Therefore, the region A2 excluding the region A1 on the flanks had the color of the use-state indicating layer (for example, in Coating No. 18, the color was a gold color of TiN) because the use-state indicating layer was formed on the base layer, and the region A1 on the flanks and the face had the color of the base layer (for example, in Coating No. 18, the color was a black color of Al$_2$O$_3$) (FIG. 5). The reason for specifying each of the distances x, y, and z in the range of 0.2 to 1.3 mm was the same as in the processing method L2.

As described above, the 40 types of indexable cutting insert Nos. 301 to 340 shown in Tables XVII and XVIII were produced. In each of the tables, the examples of the present invention are marked with "*" in the left column, and the other Nos. are comparative examples. All the outermost layers of the base layers were black regardless of the type of the coating. In the use-state indicating layer, TiN was a gold color, ZrN was a platinum color, and TiCN was a pink color.

A milling test was conducted for each of indexable cutting insert Nos. 301 to 340 under the conditions below to measure an amount of flank wear of each indexable cutting insert. Also, welding of the cutting edge to the work piece, the state of the processed surface of the work piece, and identification of the use states of the edge lines (including the corners) were observed after 1 mm cutting. The results are shown in Tables XVII and XVIII. A smaller amount of flank wear indicates excellent wear resistance. Further, a larger amount of welding of the cutting edge to the work piece indicates higher surface roughness of the work piece, and a processed surface close to a mirror surface indicates that the work piece has an excellent processed surface.

(Conditions of Milling Test)

Work piece: SKD11 block material
Cutting speed: 172 m/min
Feed: 0.16 mm/rev.
Cutting depth: 2.0 mm
Cutting oil: water-soluble oil
Cutting length: 1 m
Cutter: WGC4160R (manufactured by Sumitomo Hard Metal Co., Ltd.

The cutter was provided with one indexable cutting insert. Therefore, the feed per turn of the cutter was the same as the feed of one cutting edge.

TABLE XVII

|   | Indexable cutting insert No. | Coating No. | Processing method | Residual stress (GPa) | Amount of flank wear (mm) | Edge welding to work piece | State of processed surface of work piece | Identification of use state of edge line |
|---|---|---|---|---|---|---|---|---|
|   | 301 | 18 | A | 0.3 | 0.254 | Large | Clouded | Easy |
|   | 302 | 18 | B | −0.3 | 0.251 | Large | Clouded | Easy |
|   | 303 | 18 | C | 0.3 | 0.201 | (Note 1) | Slightly clouded | Easy |
| * | 304 | 18 | L2 | −0.3 | 0.147 | No | Close to mirror surface | Easy |
| * | 305 | 18 | M2 | −0.4 | 0.148 | No | Close to mirror surface | Easy |
|   | 306 | 18 | N2 | −0.3 | 0.145 | (Note 1) | Slightly clouded | Easy |
| * | 307 | 18 | O2 | −0.4 | 0.148 | No | Close to mirror surface | Easy |
|   | 308 | 18 | K | −0.3 | 0.146 | No | Close to mirror surface | Difficult |
|   | 309 | 19 | A | 0.3 | 0.231 | Large | Clouded | Easy |
|   | 310 | 19 | B | −0.3 | 0.230 | Large | Clouded | Easy |
|   | 311 | 19 | C | 0.3 | 0.193 | (Note 1) | Slightly clouded | Easy |
| * | 312 | 19 | L2 | −0.3 | 0.165 | No | Close to mirror surface | Easy |
| * | 313 | 19 | M2 | −0.4 | 0.166 | No | Close to mirror surface | Easy |

TABLE XVII-continued

| Indexable cutting insert No. | Coating No. | Processing method | Residual stress (GPa) | Amount of flank wear (mm) | Edge welding to work piece | State of processed surface of work piece | Identification of use state of edge line |
|---|---|---|---|---|---|---|---|
| 314 | 19 | N2 | −0.3 | 0.164 | (Note 1) | Slightly clouded | Easy |
| * 315 | 19 | O2 | −0.3 | 0.165 | No | Close to mirror surface | Easy |
| 316 | 19 | K | −0.4 | 0.165 | No | Close to mirror surface | Difficult |
| 317 | 20 | A | 0.3 | 0.211 | Large | Clouded | Easy |
| 318 | 20 | B | −0.3 | 0.210 | Large | Clouded | Easy |
| 319 | 20 | C | 0.3 | 0.208 | (Note 1) | Slightly clouded | Easy |
| * 320 | 20 | L2 | −0.3 | 0.141 | No | Close to mirror surface | Easy |
| * 321 | 20 | M2 | −0.3 | 0.140 | No | Close to mirror surface | Easy |
| 322 | 20 | N2 | −0.4 | 0.143 | (Note 1) | Slightly clouded | Easy |
| * 323 | 20 | O2 | −0.4 | 0.142 | No | Close to mirror surface | Easy |
| 324 | 20 | K | −0.3 | 0.142 | No | Close to mirror surface | Difficult |

(Note 1) Slight welding to the face

TABLE XVIII

| Indexable cutting insert No. | Coating No. | Processing method | Residual stress (GPa) | Amount of flank wear (mm) | Edge welding to work piece | State of processed surface of work piece | Identification of use state of edge line |
|---|---|---|---|---|---|---|---|
| 325 | 21 | A | 0.3 | 0.198 | Large | Clouded | Easy |
| 326 | 21 | B | −0.3 | 0.199 | Large | Clouded | Easy |
| 327 | 21 | C | 0.3 | 0.186 | (Note 1) | Slightly clouded | Easy |
| * 328 | 21 | L2 | −0.4 | 0.123 | No | Close to mirror surface | Easy |
| * 329 | 21 | M2 | −0.4 | 0.124 | No | Close to mirror surface | Easy |
| 330 | 21 | N2 | −0.3 | 0.123 | (Note 1) | Slightly clouded | Easy |
| * 331 | 21 | O2 | −0.3 | 0.123 | No | Close to mirror surface | Easy |
| 332 | 21 | K | −0.3 | 0.123 | No | Close to mirror surface | Difficult |
| 333 | 22 | A | 0.3 | 0.181 | Large | Clouded | Easy |
| 334 | 22 | B | −0.3 | 0.179 | Large | Clouded | Easy |
| 335 | 22 | C | 0.3 | 0.171 | (Note 1) | Slightly clouded | Easy |
| * 336 | 22 | L2 | −0.4 | 0.114 | No | Close to mirror surface | Easy |
| * 337 | 22 | M2 | −0.3 | 0.113 | No | Close to mirror surface | Easy |
| 338 | 22 | N2 | −0.3 | 0.113 | (Note 1) | Slightly clouded | Easy |
| * 339 | 22 | O2 | −0.3 | 0114 | No | Close to mirror surface | Easy |
| 340 | 22 | K | −0.3 | 0.113 | No | Close to mirror surface | Difficult |

(Note 1) Slight welding to the face

Figure 13:
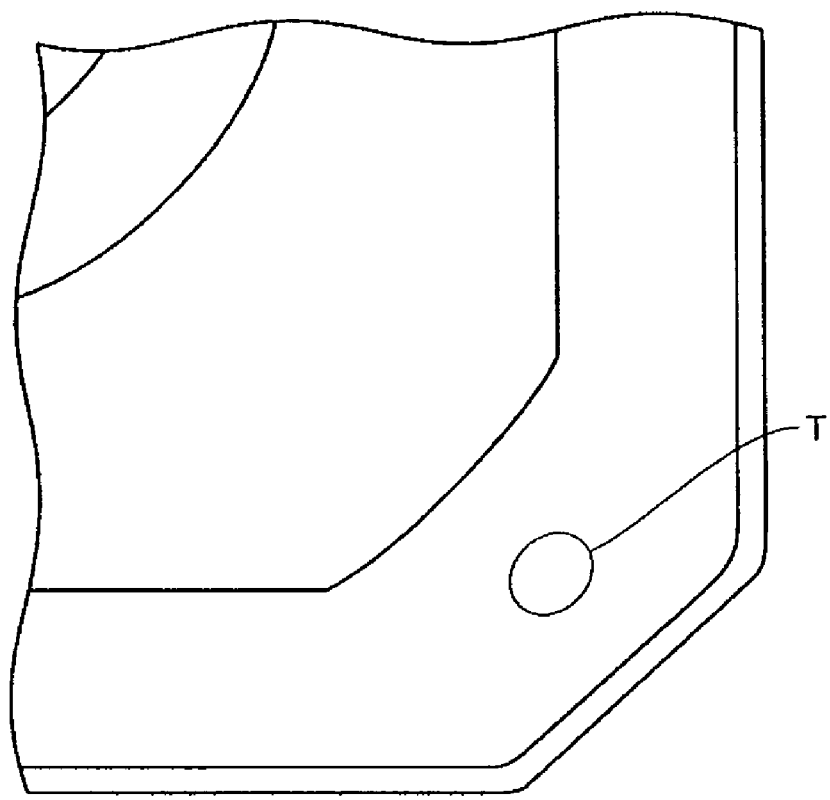
FIG. 13 is a schematic plan view showing one of the corners of an indexable cutting insert according to the present invention.

In Tables XVII and XVIII, the residual stress was measured at a spot T (positioned in a flat surface and having a diameter of 0.5 mm as viewed from the vertical direction of the flat surface) shown in FIG. 13 (a schematic enlarged plan view of the vicinity of a corner of a face of an indexable cutting insert of this example). Since there were four spots T at the respective corners of a face, an average of the values at the four spots was considered as the residual stress. Specifically, the $\sin^2 \phi$ method using an X-ray stress measurement apparatus was used as a measurement method, and in a sample coated with coating No. 18, the $\kappa$-$Al_2O_3$ layer was measured, while in a sample coated with any one of coating Nos. 19 to 22, the $\alpha$-$Al_2O_3$ layer was measured (both in the examples and the comparative examples).

The measurement region (the spot T shown in FIG. 13) is a region involved in cutting with the face. In any one of the examples, the base layer was exposed from the surface in this region, and residual stress of the uppermost layer of the base layer was measured.

Tables XVII and XVIII indicate that in the indexable cutting inserts of the examples of the present invention, the use states of the edge lines can be easily identified, thereby causing the excellent attention calling function. In addition, the cutting edge was not welded to the work piece, and the state of the work piece after cutting was close to a mirror surface.

On the other hand, in the indexable cutting inserts of the comparative examples using processing method A or B, the use states of the cutting edge lines could be identified, but the cutting edge was welded in a large amount to the work piece to make the work piece cloudy after cutting. In addition, in the indexable cutting inserts of the comparative examples using processing method C, the amount of welding to the work piece was significantly decreased, as compared with the indexable cutting inserts of the comparative examples using processing method A or B. However, welding slightly occurred on the face. In the indexable cutting inserts using processing method K, the work piece after cutting had an excellent state, but the determination of the use state of the edge line was difficult, thereby causing no attention calling function. In the indexable cutting inserts of the comparative examples using processing method N2, welding of the cutting edge to the work piece was observed because the size of the region A1 in which the use-state indicating layer was removed was insufficient, and the state (surface gloss) of the processed surface of the work piece was inferior to the surface gloss of the work pieces processed by the indexable cutting inserts of the examples of the present invention.

The above-mentioned results reveal that the indexable cutting inserts of the examples of the present invention have an excellent effect in comparison to the indexable cutting insert of each comparative example.

Furthermore, indexable cutting insert Nos. 312-2 to 312-5 were produced by the same production method as for indexable cutting insert No. 312 except that the region A1 is processed by a different blast method under different blasting conditions (a different processing time and a different distance between the work piece (the indexable cutting insert) and a nozzle) or by the brushing method (using #800 SiC brush) instead of the blasting method. Namely, the indexable cutting insert Nos. 312 and 312-2 to 312-5 have different residual stresses in each of the regions A1 and the faces. The residual stress was measured by the same method as described above (i.e., at the spot T shown in FIG. 13 is a measurement region). The results are shown in Table XIX.

Similarly, different residual stress was applied to each of the region A and the face of indexable cutting insert Nos. 315, 337, and 339 to produce indexable cutting inserts (Nos. 315-2, 337-2 to 337-5, and 339-2) shown in Table XIX.

Further, a milling test was conducted for the indexable cutting inserts (including Nos. 312, 315, 337, and 339), and indexable cutting insert Nos. 309 and 333 of the comparative examples (the residual stress being measured for Nos. 309, 312, 315, 333, 337, and 339 by the same method as described above) under the same conditions as described above to measure an amount of flank wear. Furthermore, an intermittent turning test was conducted (by providing one indexable cutting insert on a cutter) under the conditions below to measure a rate of edge defect (represented by a percentage of the number of defected corners relative to a total of 20 cutting edges (corners) measured). The results are shown in Table XIX below. A lower rate of edge defect indicates excellent toughness (defect resistance).

(Conditions of Intermittent Turning Test)
Work piece: SCM435 (laminate of three blocks)
Cutting speed: 160 m/min
Cutting depth: 2.0 mm
Feed: 0.35 mm/rev.
Wet/dry: dry
Cutting distance: 0.5 m

TABLE XIX

| Indexable cutting insert No. | Residual stress (GPa) | Amount of flank wear (mm) | Rate of edge defect (%) |
|---|---|---|---|
| 309 | 0.3 | 0.231 | 95 |
| * 312 | −0.3 | 0.165 | 60 |
| * 312-2 | 0.0 | 0.162 | 75 |
| * 312-3 | −0.6 | 0.160 | 55 |
| * 312-4 | −1.4 | 0.157 | 30 |
| * 312-5 | −2.9 | 0.155 | 10 |
| * 315 | −0.3 | 0.165 | 65 |
| * 315-2 | −1.0 | 0.158 | 45 |
| 333 | 0.3 | 0.181 | 100 |
| * 337 | −0.3 | 0.113 | 70 |
| * 337-2 | 0.1 | 0.110 | 85 |
| * 337-3 | −0.9 | 0.108 | 60 |
| * 337-4 | −1.7 | 0.106 | 40 |
| * 337-5 | −2.4 | 0.104 | 20 |
| * 339 | −0.3 | 0.114 | 65 |
| * 339-2 | −0.7 | 0.110 | 55 |

Table XIX reveals that when at least one of the layers constituting the base layer has compressive residual stress in the region A1 or a portion of at least one of the regions involved in cutting with the face, excellent toughness is exhibited. In addition, more excellent toughness is exhibited as the compressive residual stress increases.

In Table XIX, the examples of the present invention are marked with "*". In each of the examples, the cutting edge was not welded to the work piece, and the work piece had an excellent glossy surface. However, in each of the comparative examples, the cutting edge was significantly welded to the work piece, and the processed surface of the work piece had no gloss.

In addition, indexable cutting insert Nos. 312-2 and 337-2 have the effect of decreasing the amount of flank wear, preventing welding to the work piece, or improving the gloss of the work piece processed surface, but toughness was not improved. In other words, it was found that some effect of improving toughness of a cutting edge of an indexable cutting insert can be obtained by preventing welding to the work piece, but the toughness of the cutting edge can be significantly improved by imparting compressive residual stress to a specified portion of the edge as described above.

The above-mentioned results reveal that the indexable cutting inserts of the examples of the present invention have an excellent effect in comparison to the indexable cutting insert of each comparative example.

Furthermore, indexable cutting insert Nos. 337-6, 337-7, 337-8, and 337-9 (examples of the present invention) were produced by the same production method as for indexable cutting insert No. 337 except that the region A1 was processed by the blast method in a different degree of blasting (a different processing time and a different distance between the work piece (the indexable cutting insert) and a nozzle) to cause surface roughness Ra of the regions A1 and A2 as shown in Table XX. The surface roughness Ra was measured with a laser microscope (VK-8510, manufactured by Keyence Co., Ltd.). The measurement position was a R/2 position. Namely, in the region A1, the measurement was performed at a point (i.e., the center of the region A1) at a distance of c/2 from the cutting edge line in the vertical direction, while in the region A2, the measurement was performed at a point at a distance of c/2 from the boundary between the regions A1 and A2 to the regions A2 side in the vertical direction. The measurement distance was 100 μm. The residual stress was measured by the same method as described above (i.e., at the sports T shown in FIG. 13 positioned in measurement regions).

A milling test was conducted for indexable cutting insert Nos. 337, 337-6, 337-7, 337-8, and 337-9 under the same conditions as described above to measure the surface roughness Rz (JIS B0601: 2001) of a work piece of 0.1 m 1 after the start of the test by the same method as in Example 1 and measure the amount of flank wear and the rate of edge defect (by an intermittent turning test) by the same method as described above. The results are shown in Table XX.

TABLE XX

| Indexable cutting insert No. | Residual stress (GPa) | Surface roughness Ra | | | Surface roughness of work piece (Rz) | Amount of flank wear (mm) | Rate of edge defect (%) |
| --- | --- | --- | --- | --- | --- | --- | --- |
| | | Region (A1) A μm | Region (A2) B μm | A/B | | | |
| 337 | −0.3 | 0.26 | 0.33 | 0.79 | 2.0 | 0.113 | 70 |
| 337-6 | 0.2 | 0.30 | 0.32 | 0.94 | 2.4 | 0.110 | 85 |
| 337-7 | −0.5 | 0.23 | 0.32 | 0.72 | 2.0 | 0.109 | 65 |
| 337-8 | −0.8 | 0.20 | 0.32 | 0.63 | 1.8 | 0.107 | 50 |
| 337-9 | −2.5 | 0.17 | 0.31 | 0.55 | 1.6 | 0.103 | 15 |

Table XX reveals that when the surface roughness Ra of the region A1 and the surface roughness Ra of the region A2 are A (μm) and B (μm), respectively, the surface roughness Rz of the work piece is more improved as the value of A/B decreases.

These results show that in order to suppress welding between an indexable cutting insert and a work piece and prevent damage to the appearance of the work piece, it is effective to satisfy 1.0>A/B wherein A (μm) and B (μm) are the surface roughness of the regions A1 and A2, respectively, and more effective to decease the value of A/B to 0.8>A/B, preferably 0.6>A/B.

Furthermore, a lower rate of edge defect is exhibited as the compressive residual stress applied increases.

Although, in this example, an indexable cutting insert provided with a chip breaker was produced, the present invention is effective to an indexable cutting insert without a chip breaker.

Although the embodiment and examples of the present invention are described above, it is estimated that the constitutions of the embodiments and examples are appropriately combined.

It should be thought that the above-described embodiments and examples are only illustrative and not limitative. The scope of the present invention is described in the claims, not in the above description, and includes meaning equivalent to that in the claims and any change within the scope of the present invention.

The invention claimed is:

1. An indexable cutting insert (1) comprising a body (8), a base layer (12) formed on the body (8), and a use-state indicating layer (13) formed on the base layer (12);

wherein the body (8) has at least one face (2), at least two flanks (3), at least one edge line (4), and at least one corner (9);

each of the flanks (3) and the face (2) are connected to each other with the edge line (4) provided therebetween;

the corner (9) is a point of intersection of the two flanks (3) and the face (2);

the base layer (12) has a color different from the use-state indicating layer (13); and the use-state indicating layer (13) is formed on at least one of the flanks (3) so that the use-state indicating layer (13) is formed on the base layer (12) over the entire surface or a part of a region A2 excluding at least one region A1 of at least 2 mm² containing at least one corner (9).

2. The indexable cutting insert (1) according to claim 1, wherein the base layer (12) is exposed from the surfaces of the region A1 and the face (2), and at least one layer constituting the exposed base layer (12) has compressive residual stress in the region A1 or at least a portion of at least one of regions involved in cutting with the face (2).

3. The indexable cutting insert (1) according to claim 2, wherein the compressive residual stress is 0.1 GPa or more in absolute value.

4. The indexable cutting insert (1) according to claim 1, wherein when the surface roughness Ra of the region A1 is A μm, and the surface roughness Ra of the region A2 is B μm, the relation 1.0>A/B is established.

5. The indexable cutting insert (1) according to claim 1, wherein the indexable cutting insert has a plurality of edge lines (4).

6. The indexable cutting insert (1) according to claim 1, wherein the use-state indicating layer (13) is a layer more easily wearing than the base layer (12).

7. The indexable cutting insert (1) according to claim 1, wherein the base layer (12) includes an $Al_2O_3$ layer or an $Al_2O_3$-containing layer as an outermost layer.

8. The indexable cutting insert (1) according to claim 1, wherein the outermost layer of the use-state indicating layer (13) is composed of at least one metal (element) selected from the group consisting of the group IVa elements, the group Va elements, and the group VIa elements in the periodic table, Al, Si, Cu, Pt, Au, Ag, Pd, Fe, Co, and Ni, an alloy containing the metal, or a compound containing at least one element selected from the group consisting of the group IVa elements, Va elements, and VIa elements in the periodic table, Al, and Si and at least one element selected from the group consisting of carbon, nitrogen, oxygen, and boron.

9. The indexable cutting insert (1) according to claim 1, wherein the body (8) includes cemented carbide, cermet, high speed steel, ceramic, a cubic boron nitride sintered compact, a diamond sintered compact, or a silicon nitride sintered compact.

10. The indexable cutting insert (1) according to claim 1, used for drilling, end milling, milling, turning, metal sawing, gear cutting, reaming, tapping, or crankshaft pin milling.

11. A method for producing an indexable cutting insert (1) including a body (8), a base layer (12) formed on the body (8), and a use-state indicating layer (13) formed on the base layer (12), the method comprising the steps of:

forming the base layer (12) on the body (8);
forming the use-state indicating layer (13), which differs in color from the base layer (12), on the base layer (12); and
removing the use-state indicating layer (13) from a face (2) and a region including at least one region Al of 2 mm$^2$ on a flank (3) of the body, the region A1 including at least one corner (9).

* * * * *